US009672940B1

(12) United States Patent
Reusswig et al.

(10) Patent No.: US 9,672,940 B1
(45) Date of Patent: Jun. 6, 2017

(54) NON-VOLATILE MEMORY WITH FAST READ PROCESS

(71) Applicant: SANDISK TECHNOLOGIES LLC, Plano, TX (US)

(72) Inventors: Phil Reusswig, Mountain View, CA (US); Nian Niles Yang, Mountain View, CA (US); Grishma Shah, Milpitas, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/240,370

(22) Filed: Aug. 18, 2016

(51) Int. Cl.
*G11C 16/10* (2006.01)
*G11C 29/44* (2006.01)
*G11C 16/26* (2006.01)

(52) U.S. Cl.
CPC .............. *G11C 29/44* (2013.01); *G11C 16/10* (2013.01); *G11C 16/26* (2013.01)

(58) Field of Classification Search
CPC ..................... G11C 16/10; G11C 16/0483
USPC ........................... 365/185.09, 185.24
See application file for complete search history.

(56) References Cited

U.S. PATENT DOCUMENTS

| 5,859,858 | A | 1/1999 | Leeman | |
|---|---|---|---|---|
| 6,751,766 | B2 | 6/2004 | Guterman | |
| 7,117,399 | B2 * | 10/2006 | Song | G11B 5/012 360/53 |
| 7,360,136 | B2 | 4/2008 | Guterman | |
| 7,372,731 | B2 | 5/2008 | Ban | |
| 7,805,663 | B2 | 9/2010 | Brandman | |
| 7,848,171 | B2 * | 12/2010 | Miyako | G11C 7/12 365/203 |
| 8,081,508 | B2 * | 12/2011 | Kim | G11C 5/143 365/185.03 |
| 8,125,833 | B2 | 2/2012 | Sharon | |
| 8,412,987 | B2 | 4/2013 | Billing | |
| 8,812,934 | B2 | 8/2014 | Guyot | |
| 8,938,659 | B2 * | 1/2015 | Wu | G06F 11/1068 714/47.2 |
| 8,971,111 | B2 * | 3/2015 | Ghaly | G11C 16/3404 365/185.03 |
| 9,001,579 | B2 * | 4/2015 | Song | G11C 7/04 365/185.03 |
| 9,037,929 | B2 | 5/2015 | Lee | |

(Continued)

OTHER PUBLICATIONS

Guo, et al., "Non-Volatile Storage System With Self-Test for Read Performance Enhancement Feature Setup", filed Jun. 28, 2016, U.S. Appl. No. 15/195,492.

(Continued)

*Primary Examiner* — Michael Tran
(74) *Attorney, Agent, or Firm* — Vierra Magen Marcus LLP

(57) ABSTRACT

In response to a request to read data, the non-volatile memory system identifies the physical block that is storing the requested data. Read parameters associated with the physical block are also identified. The read parameters include bit error rate information. The memory system chooses whether to use a read process with a faster sense time or a read process with a slower sense time based on the bit error rate information and temperature data. The requested data is read from the identified physical block using the chosen read process configured by at least a subset of the read parameters.

24 Claims, 19 Drawing Sheets

(56) References Cited

U.S. PATENT DOCUMENTS

| | | |
|---|---|---|
| 9,111,626 B2 | 8/2015 | Kim |
| 9,135,993 B2 * | 9/2015 | Ebsen ................ G11C 13/0004 |
| 9,337,865 B2 * | 5/2016 | Cohen ................ H03M 13/1108 |
| 9,343,121 B2 * | 5/2016 | Jang ......................... G11C 7/04 |
| 9,478,303 B1 * | 10/2016 | Parker ................ G11C 16/3418 |
| 2008/0163028 A1 | 7/2008 | Mokhlesi |
| 2009/0019321 A1 | 1/2009 | Radke |
| 2010/0162084 A1 | 6/2010 | Coulson |
| 2010/0296350 A1 | 11/2010 | Kim |
| 2013/0176784 A1 | 7/2013 | Cometti |
| 2014/0101519 A1 | 4/2014 | Lee |
| 2014/0237165 A1 | 8/2014 | Seo |

OTHER PUBLICATIONS

Office Action dated Nov. 18, 2016, U.S. Appl. No. 15/195,492.
Response to Office Action dated Jan. 30, 2017, U.S. Appl. No. 15/195,492.
Notification of Allowance dated Apr. 19, 2017, U.S. Appl. No. 15/195,492.

* cited by examiner

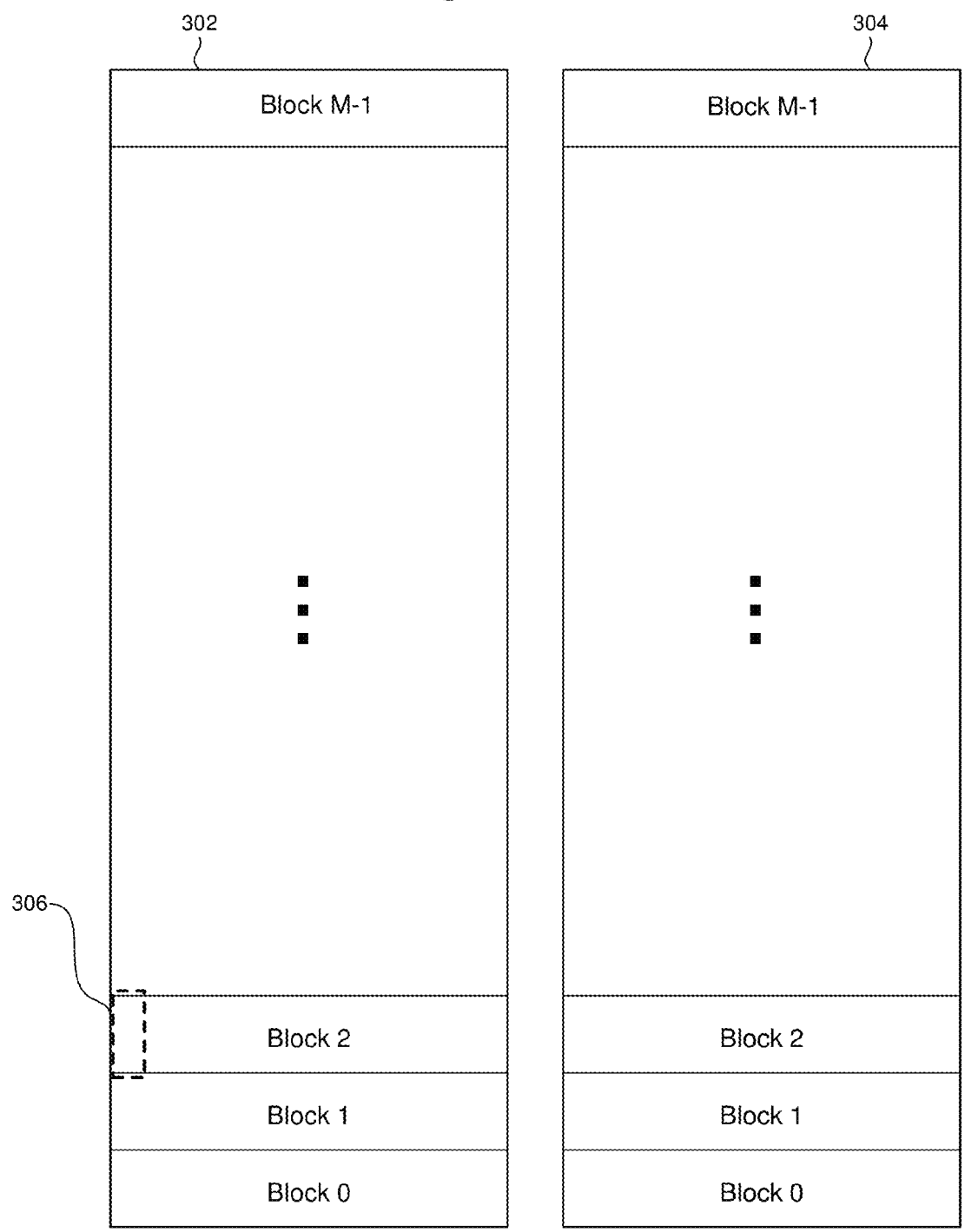

Figure 4D
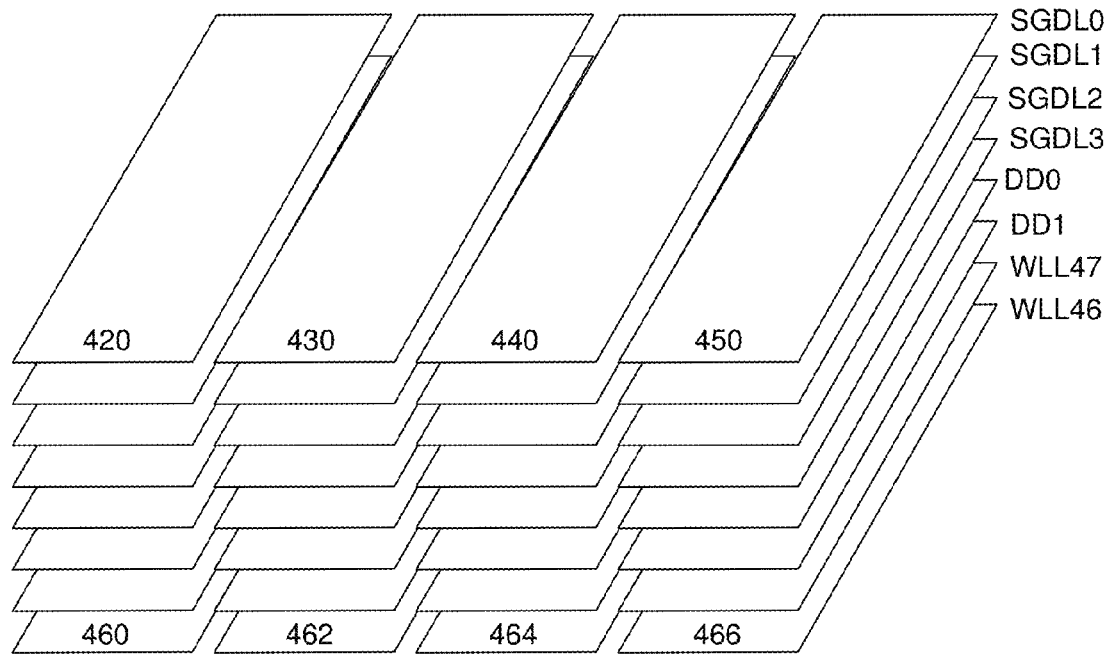
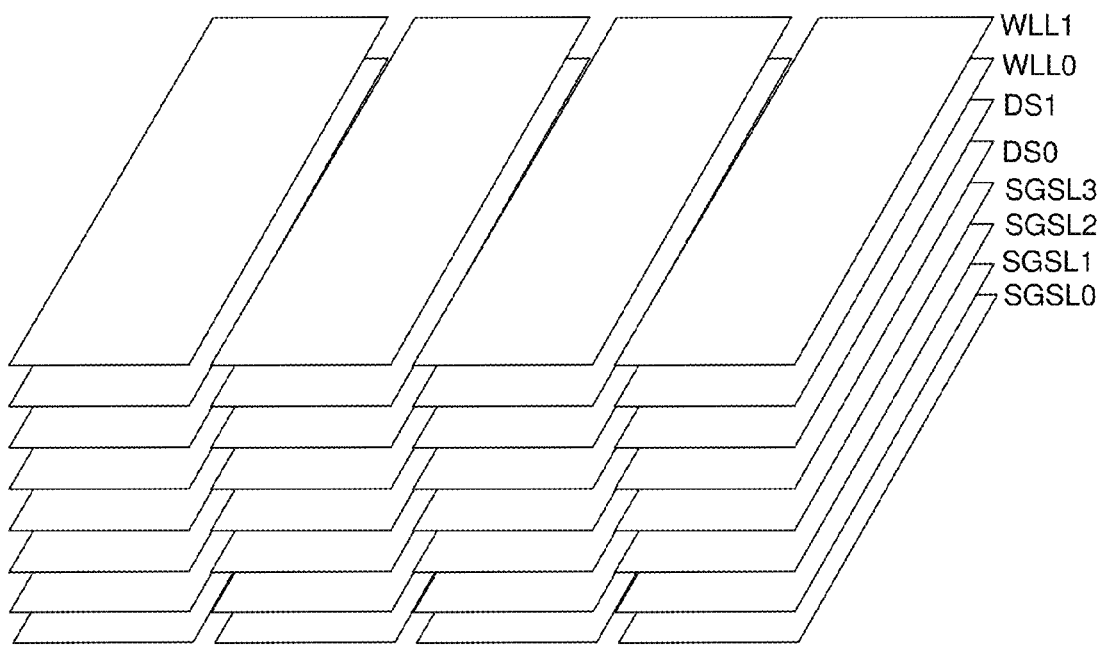

|  | S0 | S1 | S2 | S3 | S4 | S5 | S6 | S7 |
|---|---|---|---|---|---|---|---|---|
| Upper Page | 1 | 1 | 1 | 0 | 0 | 0 | 0 | 1 |
| Middle Page | 1 | 1 | 0 | 0 | 1 | 1 | 0 | 0 |
| Lower Page | 1 | 0 | 0 | 0 | 0 | 1 | 1 | 1 |

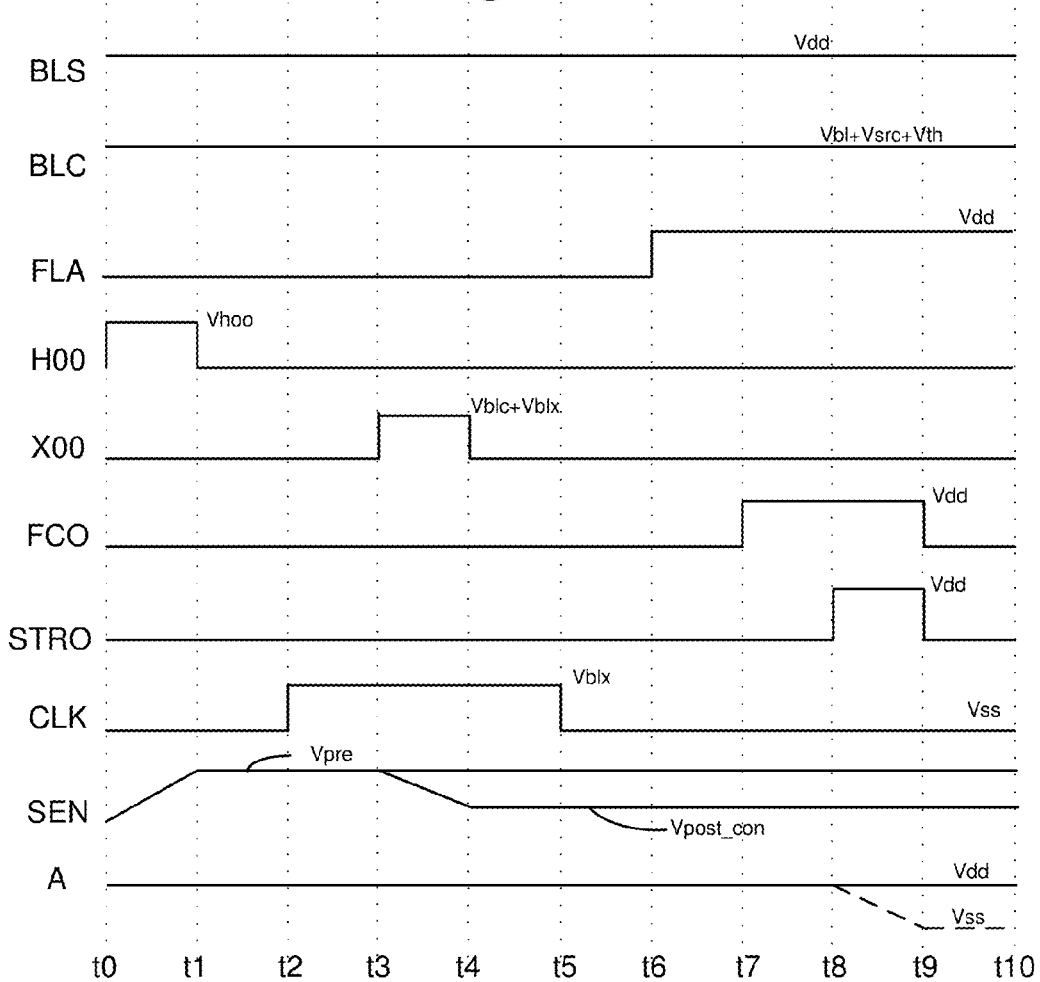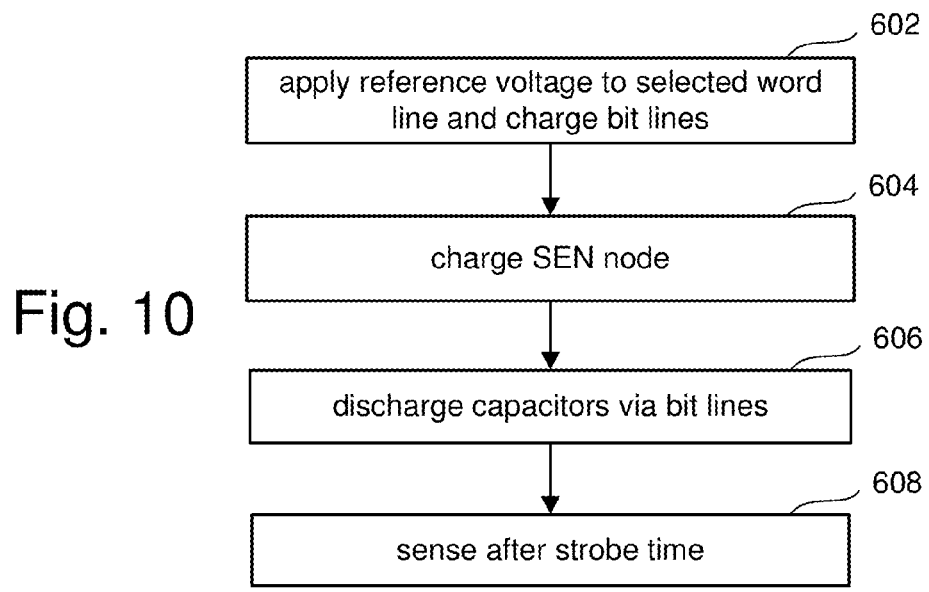

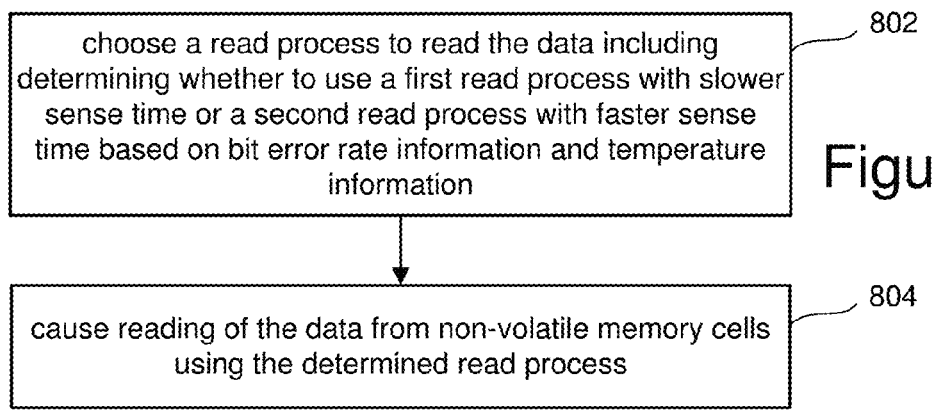

802 — choose a read process to read the data including determining whether to use a first read process with slower sense time or a second read process with faster sense time based on bit error rate information and temperature information 804 — cause reading of the data from non-volatile memory cells using the determined read process

| BER Region | Estimated BER Range (%) |
|---|---|
| 0 | BER<= 0.058 |
| 1 | 0.058<BER<=0.116 |
| 2 | 0.116<BER<=0.175 |
| 3 | 0.175<BER<=0.233 |
| 4 | 0.233<BER<=0.291 |
| 5 | 0.291<BER<=0.333 |
| 6 | 0.333<BER<=0.416 |
| 7 | 0.416<BER<=0.500 |

Figure 13

| Time Tag (t) | CVD Read Parameters | ECC Information | Temperature Region |
|---|---|---|---|
| 0 | AR3, BR3, CR3, DR3, ER3, FR3, GR3 | Target BER Region | Temperature Region |
| 1 | AR3, BR3, CR3, DR3, ER3, FR3, GR3 | Target BER Region | Temperature Region |

NON-VOLATILE MEMORY WITH FAST READ PROCESS

BACKGROUND

Semiconductor memory is widely used in various electronic devices such as cellular telephones, digital cameras, personal digital assistants, medical electronics, mobile computing devices, servers and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

A charge-trapping material can be used in non-volatile memory devices to store a charge which represents a data state. The charge-trapping material can be arranged vertically in a three-dimensional (3D) stacked memory structure. One example of a 3D memory structure is the Bit Cost Scalable (BiCS) architecture which comprises a stack of alternating conductive and dielectric layers. A memory hole is formed in the stack and a vertical NAND string is then formed by filling the memory hole with materials including a charge-trapping layer to create a vertical column of memory cells. Each memory cell can store one or more bits of data.

Memory systems can be used to store data provided by a host device or other entity. The data can then be read back and provided in response to read requests. To reduce latency in responding to read requests, it is desired to improve performance of the read processes performed by the memory system.

BRIEF DESCRIPTION OF THE DRAWINGS

Like-numbered elements refer to common components in the different figures.

FIG. 4A is a block diagram of a memory structure having two planes.

FIG. 4D depicts a view of the select gate layers and word line layers.

FIG. 9 is a timing diagram that explains the operation of various signals for the sense amplifier.

FIG. 10 is a flow chart describing one embodiment of a process for sensing using the sense amplifier.

FIG. 11 is a flow chart describing one embodiment of a process for reading.

FIG. 12 is a table of Bit Error Regions.

FIG. 13 is a table of time tags.

DETAILED DESCRIPTION

To reduce latency in responding to certain read requests, a memory system employs a standard read process and a fast read process. In some circumstances, system performance can be improved by using the fast read process. In other situations, however, use of the fast process can result in an increase in errors that need to be corrected by the error correction process. Requiring the error correction process to correct more errors will cause the error correction process to take longer, which can negate the savings in time from the fast read process or even cause the fast read process to take longer than the standard read process. Therefore, a memory system is provided that includes a standard read process and a fast read process, as well as technology for determining which process is most efficient for the current data being read.

Figure 1:
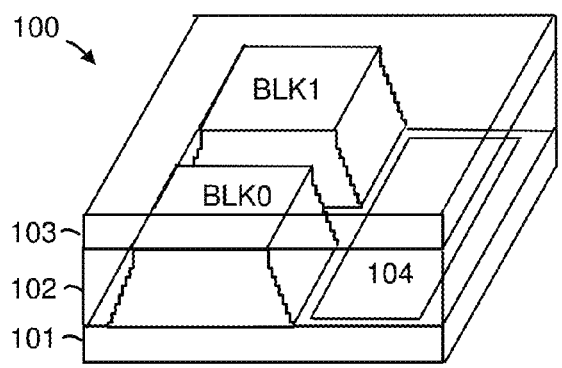
FIG. 1 is a perspective view of a 3D stacked non-volatile memory device.

FIGS. 1-4F describe one example of a memory system that can be used to implement the technology proposed herein. FIG. 1 is a perspective view of a three dimensional (3D) stacked non-volatile memory device. The memory device 100 includes a substrate 101. On and above the substrate are example blocks BLK0 and BLK1 of memory cells (non-volatile storage elements). Also on substrate 101 is peripheral area 104 with support circuits for use by the blocks. Substrate 101 can also carry circuits under the blocks, along with one or more lower metal layers which are patterned in conductive paths to carry signals of the circuits. The blocks are formed in an intermediate region 102 of the memory device. In an upper region 103 of the memory device, one or more upper metal layers are patterned in conductive paths to carry signals of the circuits. Each block comprises a stacked area of memory cells, where alternating levels of the stack represent word lines. While two blocks are depicted as an example, additional blocks can be used, extending in the x- and/or y-directions.

In one example implementation, the length of the plane in the x-direction, represents a direction in which signal paths for word lines extend (a word line or SGD line direction), and the width of the plane in the y-direction, represents a direction in which signal paths for bit lines extend (a bit line direction). The z-direction represents a height of the memory device.

Figure 2:
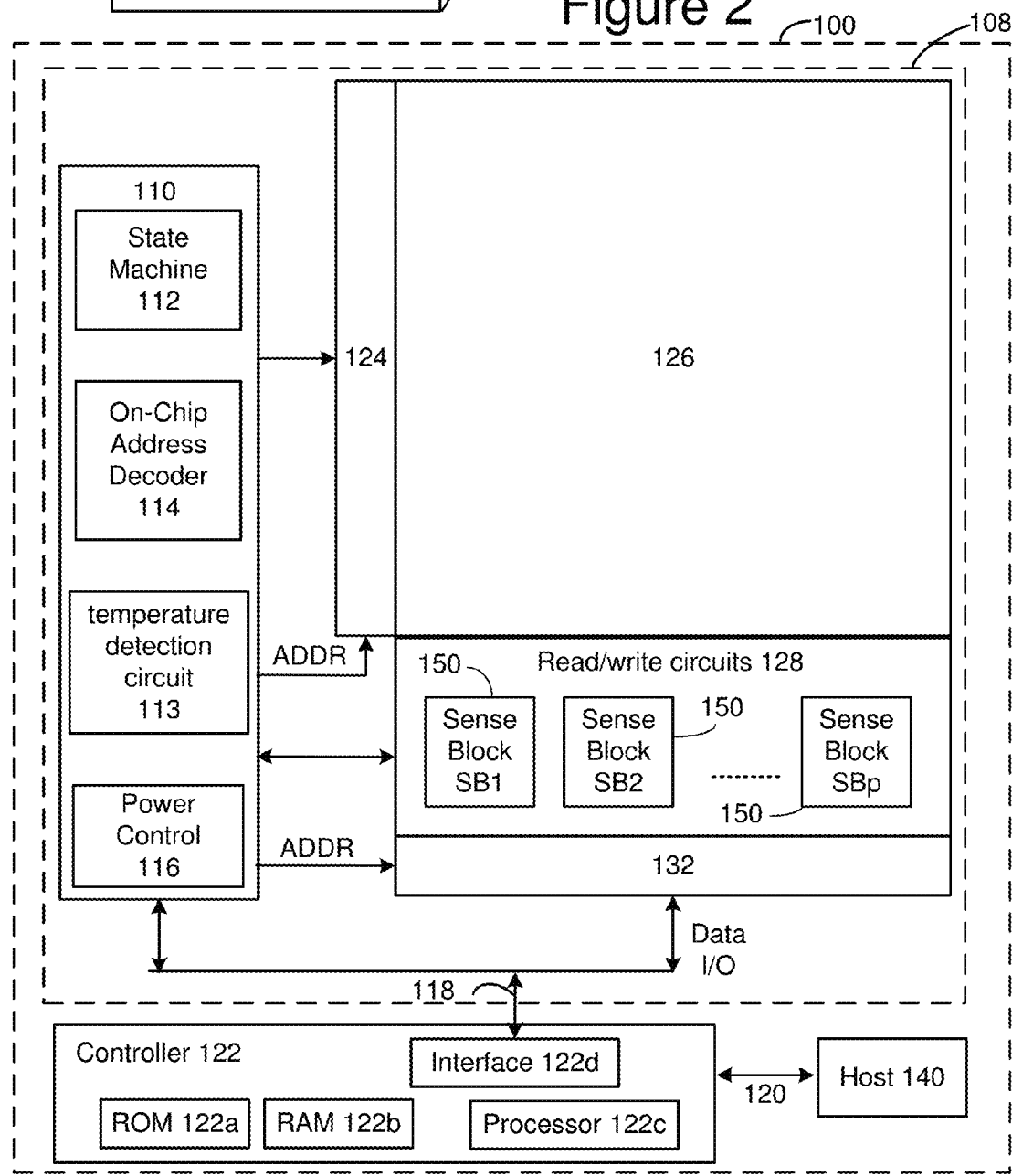
FIG. 2 is a functional block diagram of a memory device such as the 3D stacked non-volatile memory device 100 of FIG. 1.

FIG. 2 is a functional block diagram of an example memory device such as the 3D stacked non-volatile memory device 100 of FIG. 1. The components depicted in FIG. 2 are electrical circuits. Memory device 100 includes one or more memory die 108. Each memory die 108 includes a three dimensional memory structure 126 of memory cells (such as, for example, a 3D array of memory cells), control circuitry 110, and read/write circuits 128. In other embodiments, a two dimensional array of memory cells can be used. Memory structure 126 is addressable by word lines via a row decoder 124 and by bit lines via a column decoder 132. The read/write circuits 128 include multiple sense blocks 150 including SB1, SB2, . . . , SBp (sensing circuitry) and allow a page of memory cells to be read or programmed in parallel. In some systems, a Controller 122 is included in the same memory device 100 (e.g., a removable storage card) as the one or more memory die 108. However, in other systems, the Controller can be separated from the memory die 108. In some embodiments the Controller will be on a different die than the memory die. In some embodiments, one Controller 122 will communicate with multiple memory die 108. In other embodiments, each memory die 108 has its own Controller. Commands and data are transferred between the host 140 and Controller 122 via a data bus 120, and between Controller 122 and the one or more memory die 108 via lines 118. In one embodiment, memory die 108 includes a set of input and/or output (I/O) pins that connect to lines 118.

Memory structure 126 may comprise one or more arrays of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

Control circuitry 110 cooperates with the read/write circuits 128 to perform memory operations (e.g., erase, program, read, and others) on memory structure 126, and includes a state machine 112, an on-chip address decoder 114, a power control module 116 and a temperature detection circuit 116. The state machine 112 provides die-level control of memory operations. Temperature detection circuit 113 (which is on memory die 108) is configured to detect temperature at the memory structure 126, and can be any suitable temperature detection circuit known in the art. In one embodiment, state machine 112 is programmable by the software. In other embodiments, state machine 112 does not use software and is completely implemented in hardware (e.g., electrical circuits). In one embodiment, control circuitry 110 includes registers, ROM fuses and other storage devices for storing default values such as base voltages and other parameters.

The on-chip address decoder 114 provides an address interface between addresses used by host 140 or Controller 122 to the hardware address used by the decoders 124 and 132. Power control module 116 controls the power and voltages supplied to the word lines and bit lines during memory operations. It can include drivers for word line layers (discussed below) in a 3D configuration, select transistors (e.g., SGS and SGD transistors, described below) and source lines. Power control module 116 may include charge pumps for creating voltages. The sense blocks include bit line drivers. An SGS transistor is a select gate transistor at a source end of a NAND string, and an SGD transistor is a select gate transistor at a drain end of a NAND string.

Any one or any combination of control circuitry 110, state machine 112, decoders 114/124/132, temperature detection circuit 113, power control module 116, sense blocks 150, read/write circuits 128, and Controller 122 can be considered one or more control circuits (or a managing circuit) that performs the functions described herein.

The (on-chip or off-chip) Controller 122 (which in one embodiment is an electrical circuit) may comprise one or more processors 122c, ROM 122a, RAM 122b and a Memory Interface 122d, all of which are interconnected. One or more processors 122c is one example of a control circuit. Other embodiments can use state machines or other custom circuits designed to perform one or more functions. The storage devices (ROM 122a, RAM 122b) comprises code such as a set of instructions, and the processor 122c is operable to execute the set of instructions to provide the functionality described herein. Alternatively or additionally, processor 122c can access code from a storage device in the memory structure, such as a reserved area of memory cells connected to one or more word lines. Memory interface 122d, in communication with ROM 122a, RAM 122b and processor 122c, is an electrical circuit (electrical interface) that provides an electrical interface between Controller 122 and one or more memory die 108. For example, memory interface 122d can change the format or timing of signals, provide a buffer, isolate from surges, latch I/O, etc. Processor 122c can issue commands to control circuitry 110 (or any other component of memory die 108) via Memory Interface 122d. In one embodiment, processor 122c can access code from ROM 122a or RAM 122b to detect read disturb in open blocks and take action to mitigate the read disturb, including determining that a particular block of non-volatile memory cells is an open block and has been subjected to a minimum number of read operations; reading memory cells connected to an open word line of the particular block and identifying unerased bits; and copying data for the particular block to a new block if there are more than a minimum number of unerased bits for the open word line.

Multiple memory elements in memory structure 126 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors.

A NAND flash memory array may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three dimensional memory array is arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory cells. The vertical columns may be arranged in a two dimensional configuration, e.g., in an x-y plane, resulting in a three dimensional arrangement of memory cells, with memory cells on multiple vertically stacked memory planes. Other configurations of memory elements in three dimensions can also constitute a three dimensional memory array.

By way of non-limiting example, in a three dimensional NAND memory array, the memory elements may be coupled together to form vertical NAND strings that traverse across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
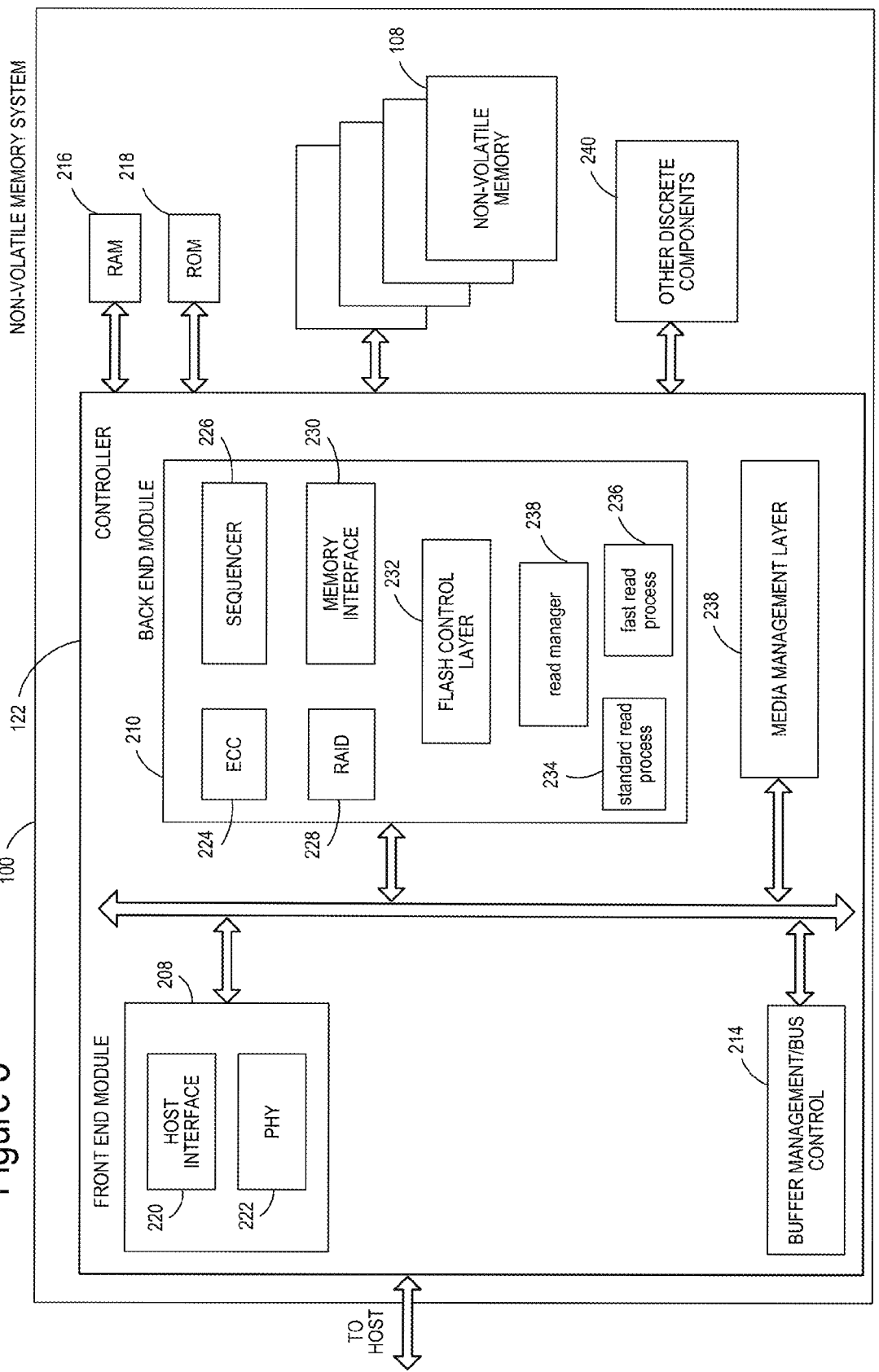
FIG. 3 is a block diagram depicting one embodiment of a Controller.

FIG. 3 is a block diagram of example memory system 100, depicting more details of Controller 122. As used herein, a flash memory Controller is a device that manages data stored on flash memory and communicates with a host, such as a computer or electronic device. A flash memory Controller can have various functionality in addition to the specific functionality described herein. For example, the flash memory Controller can format the flash memory to ensure the memory is operating properly, map out bad flash memory cells, and allocate spare memory cells to be substituted for future failed cells. Some part of the spare cells can be used to hold firmware to operate the flash memory Controller and implement other features. In operation, when a host needs to read data from or write data to the flash memory, it will communicate with the flash memory Controller. If the host provides a logical address to which data is to be read/written, the flash memory Controller can convert the logical address received from the host to a physical address in the flash memory. (Alternatively, the host can provide the physical address). The flash memory Controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between Controller 122 and non-volatile memory die 108 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system. For example, the flash memory may be embedded within the host, such as in the form of a solid state disk (SSD) drive installed in a personal computer.

In some embodiments, non-volatile memory system 100 includes a single channel between Controller 122 and non-volatile memory die 108, the subject matter described herein is not limited to having a single memory channel. For example, in some memory system architectures, 2, 4, 8 or more channels may exist between the Controller and the memory die, depending on Controller capabilities. In any of the embodiments described herein, more than a single channel may exist between the Controller and the memory die, even if a single channel is shown in the drawings.

As depicted in FIG. 3, Controller 112 includes a front end module 208 that interfaces with a host, a back end module 210 that interfaces with the one or more non-volatile memory die 108, and various other modules that perform functions which will now be described in detail.

The components of Controller 122 depicted in FIG. 3 may take the form of a packaged functional hardware unit (e.g., an electrical circuit) designed for use with other components, a portion of a program code (e.g., software or firmware) executable by a (micro) processor or processing circuitry that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for Controller 122 to perform the functions described herein. The architecture depicted in FIG. 3 is one example implementation that may (or may not) use the components of Controller 122 depicted in FIG. 2 (i.e. RAM, ROM, processor, interface).

Referring again to modules of the Controller 122, a buffer manager/bus control 214 manages buffers in random access memory (RAM) 216 and controls the internal bus arbitration of Controller 122. A read only memory (ROM) 218 stores system boot code. Although illustrated in FIG. 3 as located separately from the Controller 122, in other embodiments one or both of the RAM 216 and ROM 218 may be located within the Controller. In yet other embodiments, portions of RAM and ROM may be located both within the Controller 122 and outside the Controller. Further, in some implementations, the Controller 122, RAM 216, and ROM 218 may be located on separate semiconductor die.

Front end module 208 includes a host interface 220 and a physical layer interface (PHY) 222 that provide the electrical interface with the host or next level storage Controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction code (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra WLs within a block. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back end module 210.

One embodiment includes a read manager 238 that manages the read process, a standard read process module 234 and a fast read process module 236 (all three of which can be all software, all electrical circuits or a combination of software and electrical circuits). Standard read process module 234 includes the logic and/or instructions for implementing a standard read process with a slower sense time, as described below. Fast read process module 236 includes the logic and/or instructions for implementing a fast read process with a faster (shorter) sense time, as described below. Read Manager 238 includes the logic for choosing whether to use the standard read process of standard read process module 234 or the fast read process of fast read process module 236 based on temperature and bit error rate ("BER"), as discussed below with respect to FIGS. 11-19.

Additional components of system 100 illustrated in FIG. 3 include media management layer 238, which performs wear leveling of memory cells of non-volatile memory die 108. System 100 also includes other discrete components 240, such as external electrical interfaces, external RAM, resistors, capacitors, or other components that may interface with Controller 122. In alternative embodiments, one or more of the physical layer interface 222, RAID module 228, media management layer 238 and buffer management/bus Controller 214 are optional components that are not necessary in the Controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the flash memory 126 of die 108. The MML 238 may be needed because: 1) the flash memory may have limited endurance; 2) the flash memory 126 may only be written in multiples of pages; and/or 3) the flash memory 126 may not be written unless it is erased as a block. The MML 238 understands these potential limitations of the flash memory 126 which may not be visible to the host. Accordingly, the MML 238 attempts to translate the writes from host into writes into the flash memory 126. As described below, erratic bits may be identified and recorded using the MML 238. This recording of erratic bits can be used for evaluating the health of blocks and/or word lines (the memory cells on the word lines).

Controller 122 may interface with one or more memory dies 108. In in one embodiment, Controller 122 and multiple memory dies (together comprising non-volatile storage system 100) implement a solid state drive (SSD), which can emulate, replace or be used instead of a hard disk drive inside a host, as a NAS device, etc. Additionally, the SSD need not be made to work as a hard drive.

In one embodiment, as discussed below with respect to FIGS. 7-12B, Controller 122 determines candidate bad blocks to test for usability based on previously recorded error codes, causes testing of the candidate bad blocks for usability, and causes storage of information in candidate blocks determined to be still usable.

Figure 4:
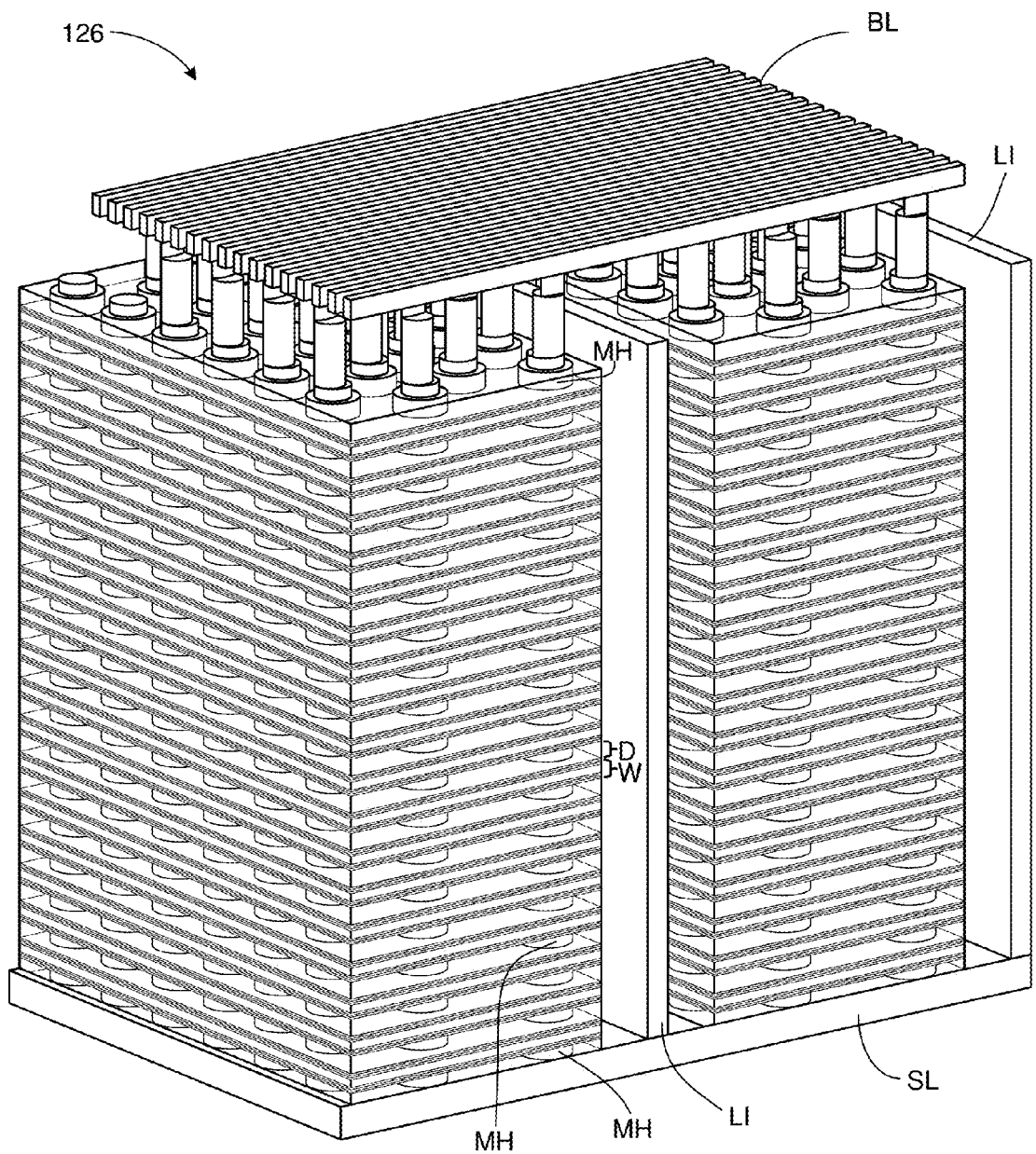
FIG. 4 is a perspective view of a portion of one embodiment of a monolithic three dimensional memory structure.

FIG. 4 is a perspective view of a portion of one example embodiment of a monolithic three dimensional memory structure 126, which includes a plurality memory cells. For example, FIG. 4 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-216 alternating dielectric layers and conductive layers, for example, 96 data word line layers, 8 select layers, 4 dummy word line layers and 108 dielectric layers. More or less than 108-216 layers can also be used. As will be explained below, the alternating dielectric layers and conductive layers are divided into four "fingers" by local interconnects LI. FIG. 4 only shows two fingers and two local interconnects LI. Below and the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data. More details of the three dimensional monolithic memory structure 126 is provided below with respect to FIG. 4A-4F.

FIG. 4A is a block diagram explaining one example organization of memory structure 126, which is divided into two planes 302 and 304. Each plane is then divided into M blocks. In one example, each plane has about 2000 blocks. However, different numbers of blocks and planes can also be used. In one embodiment, for two plane memory, the block IDs are usually such that even blocks belong to one plane and odd blocks belong to another plane; therefore, plane 302 includes block 0, 2, 4, 6, . . . and plane 304 includes blocks 1, 3, 5, 7, . . . . In on embodiment, a block of memory cells is a unit of erase. That is, all memory cells of a block are erased together. In other embodiments, memory cells can be grouped into blocks for other reasons, such as to organize the memory structure 126 to enable the signaling and selection circuits.

Figure 4B:
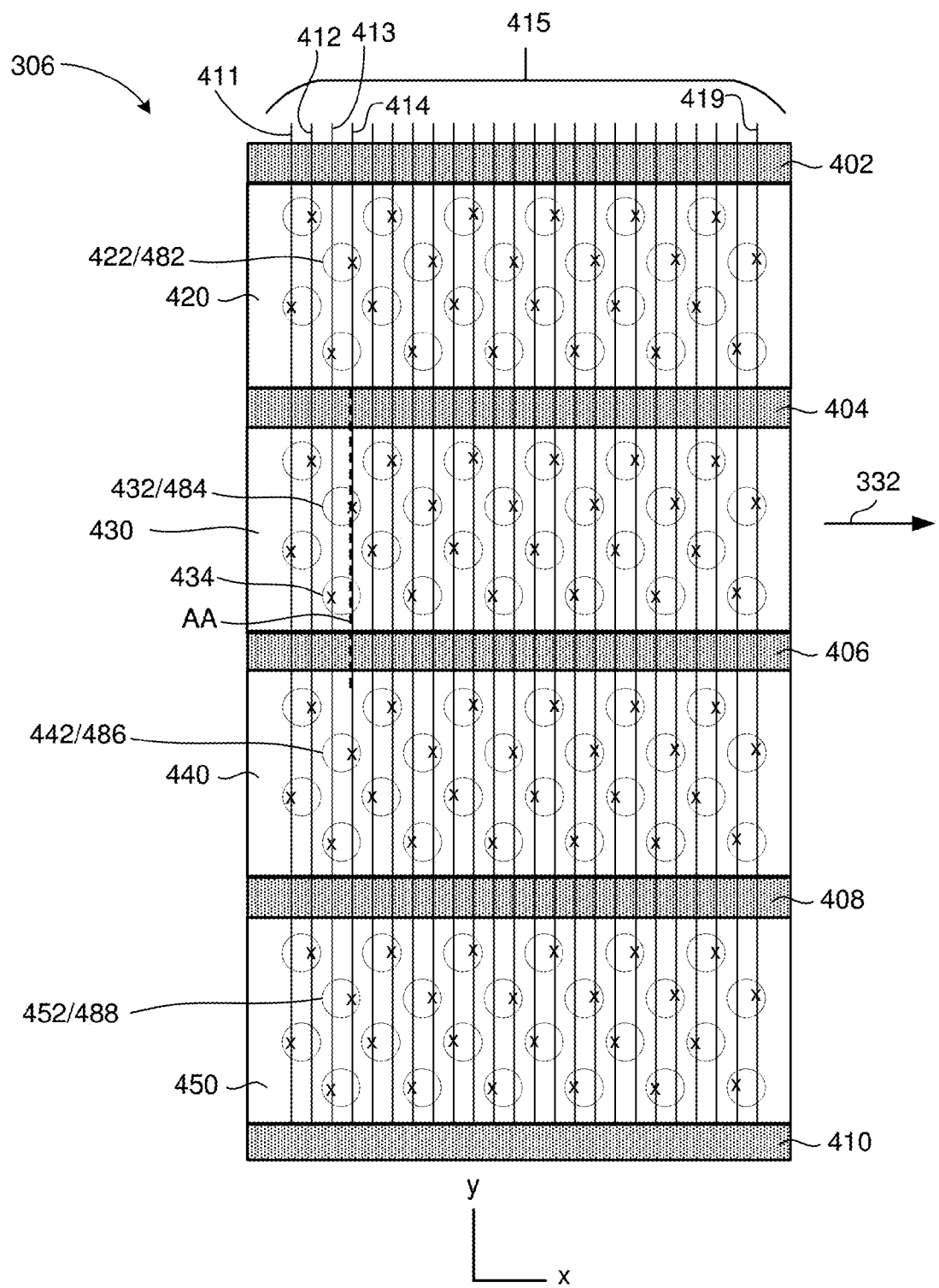
FIG. 4B depicts a top view of a portion of a block of memory cells.

FIGS. 4B-4F depict an example 3D NAND structure. FIG. 4B is a block diagram depicting a top view of a portion of one block from memory structure 126. The portion of the block depicted in FIG. 4B corresponds to portion 306 in block 2 of FIG. 4A. As can be seen from FIG. 4B, the block depicted in FIG. 4B extends in the direction of 332. In one embodiment, the memory array will have 60 layers. Other embodiments have less than or more than 60 layers. However, FIG. 4B only shows the top layer.

FIG. 4B depicts a plurality of circles that represent the vertical columns. Each of the vertical columns include multiple select transistors and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 330 and in the direction of arrow 332, the block includes more vertical columns than depicted in FIG. 4B FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together at the end of the block to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side selection lines and the drain side selection lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
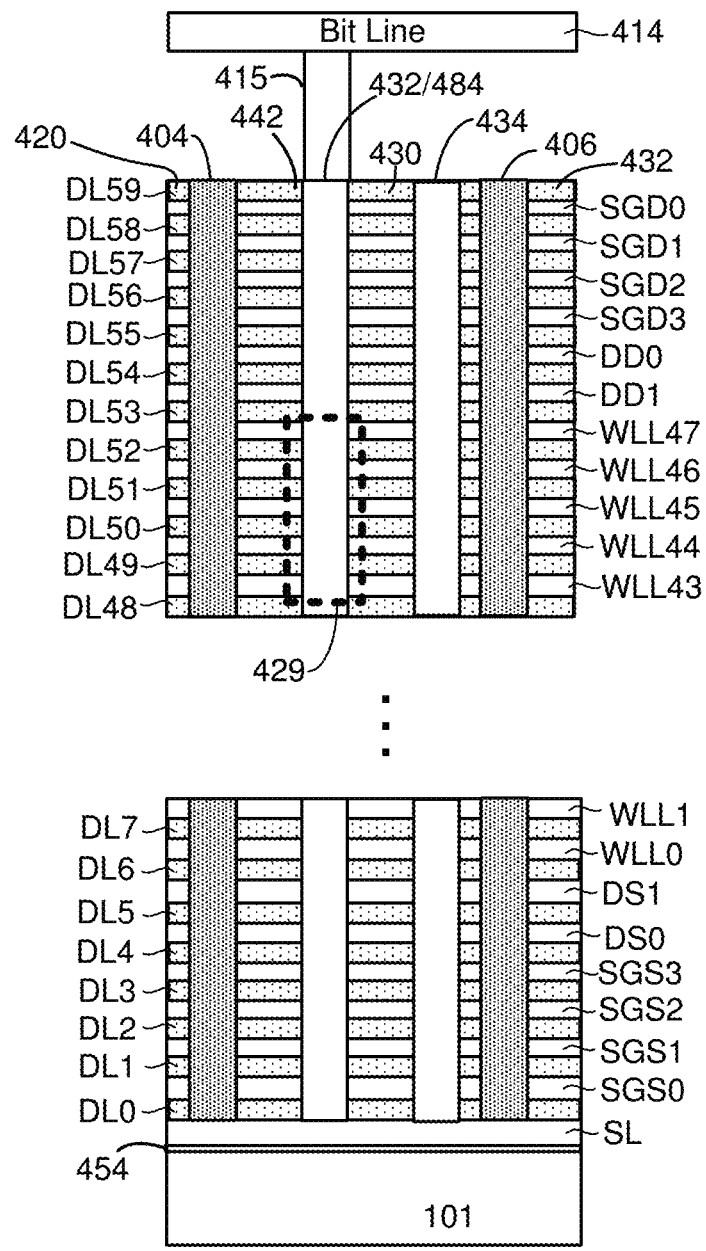
FIG. 4C depicts a cross sectional view of a portion of a block of memory cells.

FIG. 4C depicts a portion of an embodiment of three dimensional memory structure 126 showing a cross-sectional view along line AA of FIG. 4B. This cross sectional view cuts through vertical columns 432 and 434 and region 430 (see FIG. 4B). The structure of FIG. 4C includes four drain side select layers SGD0, SGD1, SGD2 and SGD3; four source side select layers SGS0, SGS1, SGS2 and SGS3; four dummy word line layers DD0, DD1, DS0 and DS1; and forty eight data word line layers WLL0-WLL47 for connecting to data memory cells. Other embodiments can implement more or less than four drain side select layers, more or less than four source side select layers, more or less than four dummy word line layers, and more or less than forty eight word line layers (e.g., 96 word line layers). Vertical columns 432 and 434 are depicted protruding through the drain side select layers, source side select layers, dummy word line layers and word line layers. In one embodiment, each vertical column comprises a NAND string. For example, vertical column 432 comprises NAND string 484. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to Bit Line 414 via connector 415. Local interconnects 404 and 406 are also depicted.

For ease of reference, drain side select layers SGD0, SGD1, SGD2 and SGD3; source side select layers SGS0, SGS1, SGS2 and SGS3; dummy word line layers DD0, DD1, DS0 and DS1; and word line layers WLL0-WLL47 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL59. For example, dielectric layers DL49 is above word line layer WLL43 and below word line layer WLL44. In one embodiment, the dielectric layers are made from SiO$_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layer WLL0-WLL47 connect to memory cells (also called data memory cells). Dummy word line layers DD0, DD1, DS0 and DS1 connect to dummy memory cells. A dummy memory cell does not store host data (data provided from the host, such as data from a user of the host), while a data memory cell is eligible to store host data. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

FIG. 4D depicts a logical representation of the conductive layers (SGD0, SGD1, SGD2, SGD3, SGS0, SGS1, SGS2, SGS3, DD0, DD1, DS0, DS1, and WLL0-WLL47) for the block that is partially depicted in FIG. 4C. As mentioned above with respect to FIG. 4B, in one embodiment local interconnects 402, 404, 406, 408 and 410 break up each conductive layers into four regions or fingers. For example, word line layer WLL31 is divided into regions 460, 462, 464 and 466. For word line layers (WLL0-WLL31), the regions are referred to as word line fingers; for example, word line layer WLL46 is divided into word line fingers 460, 462, 464 and 466. In one embodiment, the four word line fingers on a same level are connected together. In another embodiment, each word line finger operates as a separate word line.

Drain side select gate layer SGD0 (the top layer) is also divided into regions 420, 430, 440 and 450, also known as fingers or select line fingers. In one embodiment, the four select line fingers on a same level are connected together. In another embodiment, each select line finger operates as a separate word line.

Figure 4E:
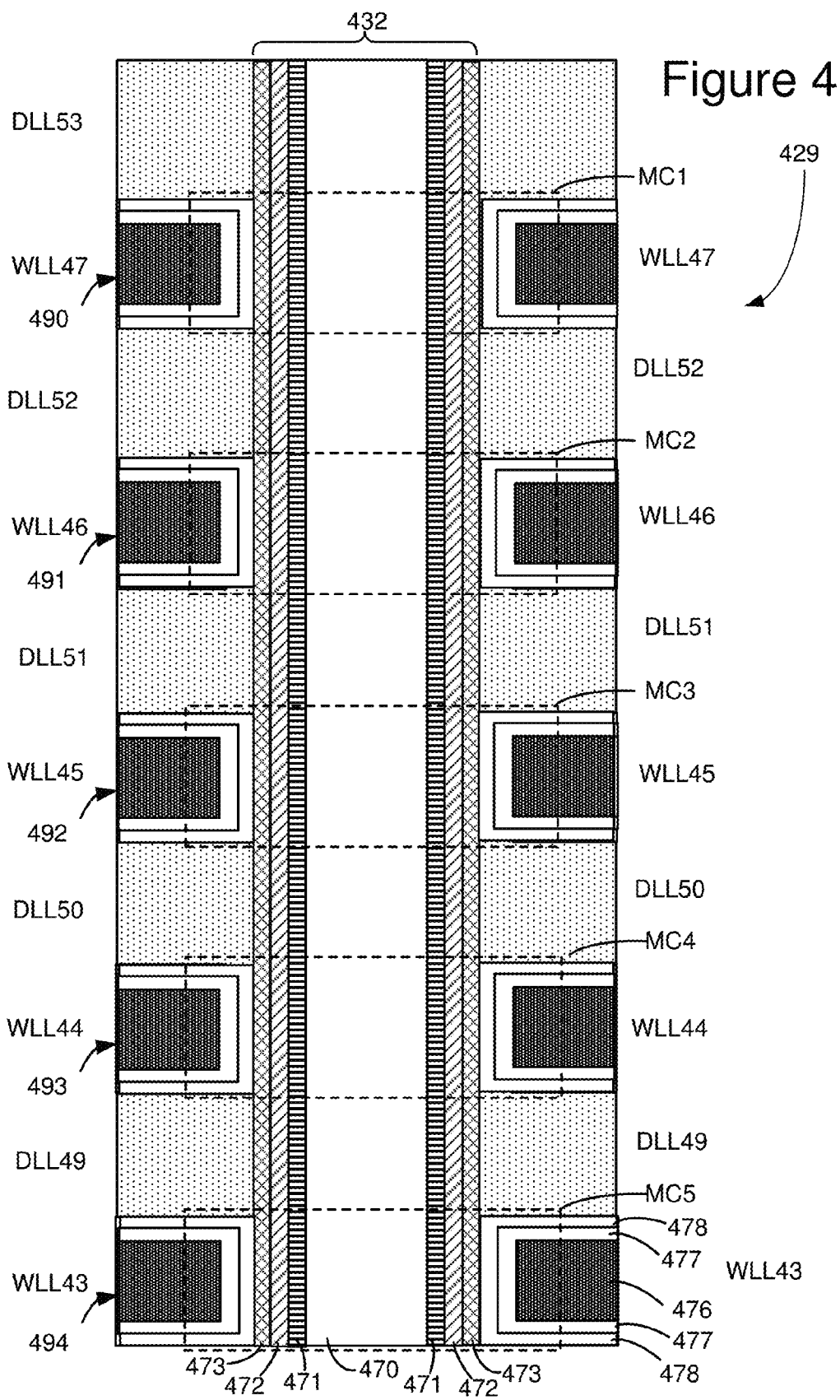
FIG. 4E is a cross sectional view of a vertical column of memory cells.

FIG. 4E depicts a cross sectional view of region 429 of FIG. 4C that includes a portion of vertical column 432. In one embodiment, the vertical columns are round and include four layers; however, in other embodiments more or less than four layers can be included and other shapes can be used. In one embodiment, vertical column 432 includes an inner core layer 470 that is made of a dielectric, such as $SiO_2$. Other materials can also be used. Surrounding inner core 470 is polysilicon channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. The technology described herein is not limited to any particular material or structure.

FIG. 4E depicts dielectric layers DLL49, DLL50, DLL51, DLL52 and DLL53, as well as word line layers WLL43, WLL44, WLL45, WLL46, and WLL47. Each of the word line layers includes a word line region 476 surrounded by an aluminum oxide layer 477, which is surrounded by a blocking oxide ($SiO_2$) layer 478. The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL47 and a portion of vertical column 432 comprise a memory cell MC1. Word line layer WLL46 and a portion of vertical column 432 comprise a memory cell MC2. Word line layer WLL45 and a portion of vertical column 432 comprise a memory cell MC3. Word line layer WLL44 and a portion of vertical column 432 comprise a memory cell MC4. Word line layer WLL43 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Figure 4F:
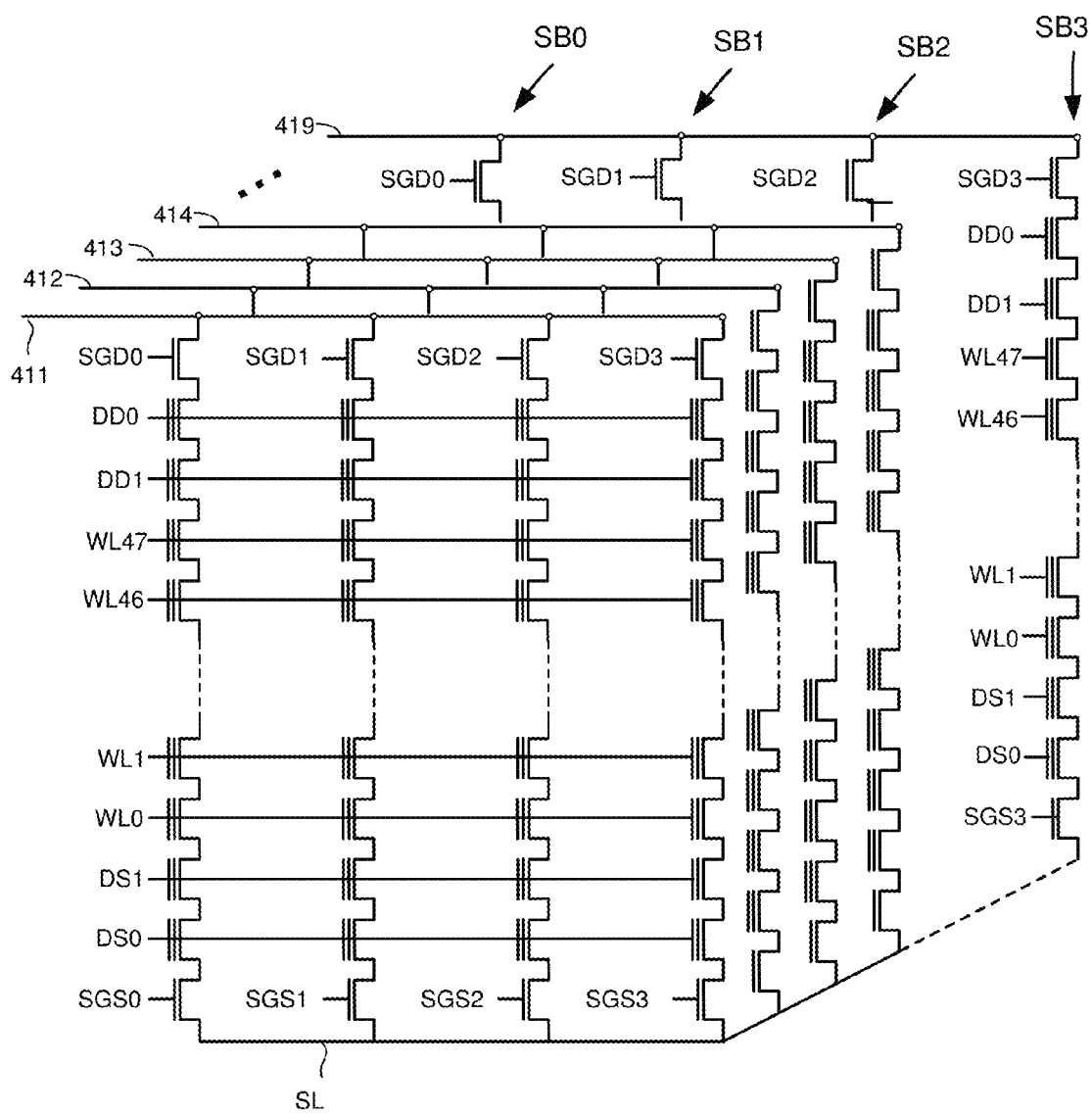
FIG. 4F is a schematic of a plurality of NAND strings.

FIG. 4F shows physical word lines WLL0-WLL47 running across the entire block. The structure of FIG. 4G corresponds to portion 306 in Block 2 of FIGS. 4A-F, including bit lines 411, 412, 413, 414, . . . 419. Within the block, each bit line connected to four NAND strings. Drain side selection lines SGD0, SGD1, SGD2 and SGD3 are used to determine which of the four NAND strings connect to the associated bit line. The block can also be thought of as divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

Although the example memory system of FIGS. 4-4F is a three dimensional memory structure that includes vertical NAND strings with charge-trapping material, other (2D and 3D) memory structures can also be used with the technology described herein. For example, floating gate memories (e.g., NAND-type and NOR-type flash memory ReRAM memories, magnetoresistive memory (e.g., MRAM), and phase change memory (e.g., PCRAM) can also be used.

One example of a ReRAM memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. This configuration is known as a spin valve and is the simplest structure for an MRAM bit. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCRAM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

Figures 5, 6:
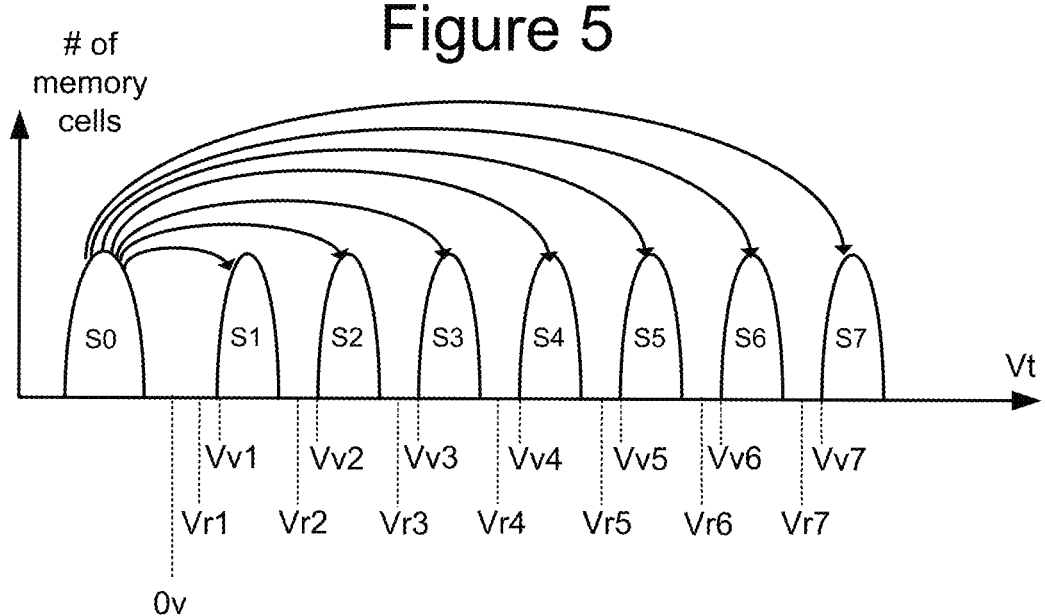
FIG. 5 depicts threshold voltage distributions.
FIG. 6 is a table describing one example of an assignment of data values to data states.

The memory systems discussed above can be erased, programmed and read. At the end of a successful programming process (with verification), the threshold voltages of the memory cells should be within one or more distributions of threshold voltages for programmed memory cells or within a distribution of threshold voltages for erased memory cells, as appropriate. FIG. 5 illustrates example threshold voltage distributions for the memory cell array when each memory cell stores three bits of data. Other embodiments, however, may use other data capacities per memory cell (e.g., such as one, two, four, or five bits of data per memory cell). FIG. 5 shows eight threshold voltage distributions, corresponding to eight data states. The first threshold voltage distribution (data state) S0 represents memory cells that are erased. The other seven threshold voltage distributions (data states) S1-S17 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 5 also shows seven read reference voltages, Vr1, Vr2, Vr3, Vr4, Vr5, Vr6, and Vr7, for reading data from memory cells. By testing (e.g., performing sense operations) whether the threshold voltage of a given memory cell is above or below the seven read reference voltages, the system can determine what data state (i.e., S0, S1, S2, S3, . . . ) the memory cell is in.

FIG. 5 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 6 represent the full sequence programming. The technology described herein can also be used with other types of programming in addition to full sequence programming (including, but not limited to, multiple stage/phase programming). In some embodiments, data states S1-D7 can overlap, with Controller 122 relying on ECC to identify the correct data being stored.

FIG. 6 is a table describing one example of an assignment of data values to data states. In the table of FIG. 6, S0=111, S1=110, S2=200, S3=000, S4=010, S5=011, S6=001 and S7=101. Other encodings of data can also be used. No particular data encoding is required by the technology disclosed herein.

In one embodiment, when a block is subjected to an erase operation, all memory cells are moves to data state S0, the erased state. In the embodiment of FIG. 6, all bits stored in a memory cell are 1 when the memory cells is erased (e.g., in data state S0). If an erased memory cell is subjected to read disturb, it is possible that the memory cell may have its threshold voltage moved to a value above Vr1, which would cause the lower page data bit to flip from 1 to 0, which is an error.

Figure 7A:
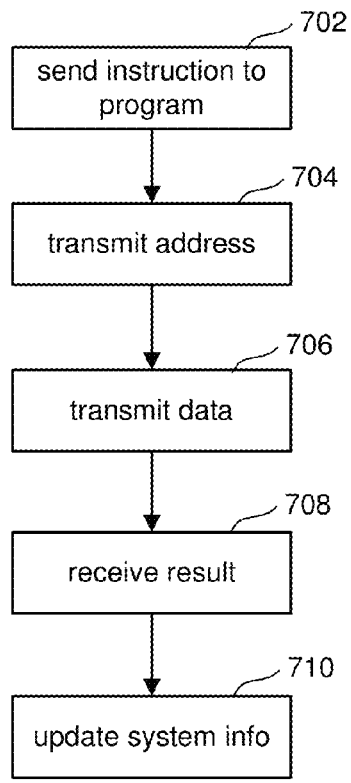
FIG. 7A is a flow chart describing one embodiment of a process for programming.

FIG. 7A is a flowchart describing one embodiment of a process for programming that is performed by Controller 122. In some embodiments, rather than have a dedicated Controller, the host can perform the functions of the Controller. In step 702, Controller 122 sends instructions to one or more memory die 108 to program data. In step 704, Controller 122 sends one or more logical addresses to one or more memory die 108. The one or more logical addresses indicate where to program the data. In step 706, Controller 122 sends the data to be programmed to the one or more memory die 108. In step 708, Controller 122 receives a result of the programming from the one or more memory die 108. Example results include that the data was programmed successfully, an indication that the programming operation failed, and indication that the data was programmed but at a different location, or other result. In step 710, in response to the result received in step 708, Controller 122 updates the system information that it maintains. In one embodiment, the system maintains tables of data that indicate status information for each block. This information may include a mapping of logical addresses to physical addresses, which blocks/word lines are open/closed (or partially opened/closed), which blocks/word lines are bad, etc.

In some embodiments, before step 702, Controller 122 would receive host data and an instruction to program from the host, and the Controller would run the ECC engine 224 to create code words from the host data, as known in the art and described in more detail below. These code words are the data transmitted in step 706. Controller can also scramble the data to achieve wear leveling with respect to the memory cells.

Figure 7B:
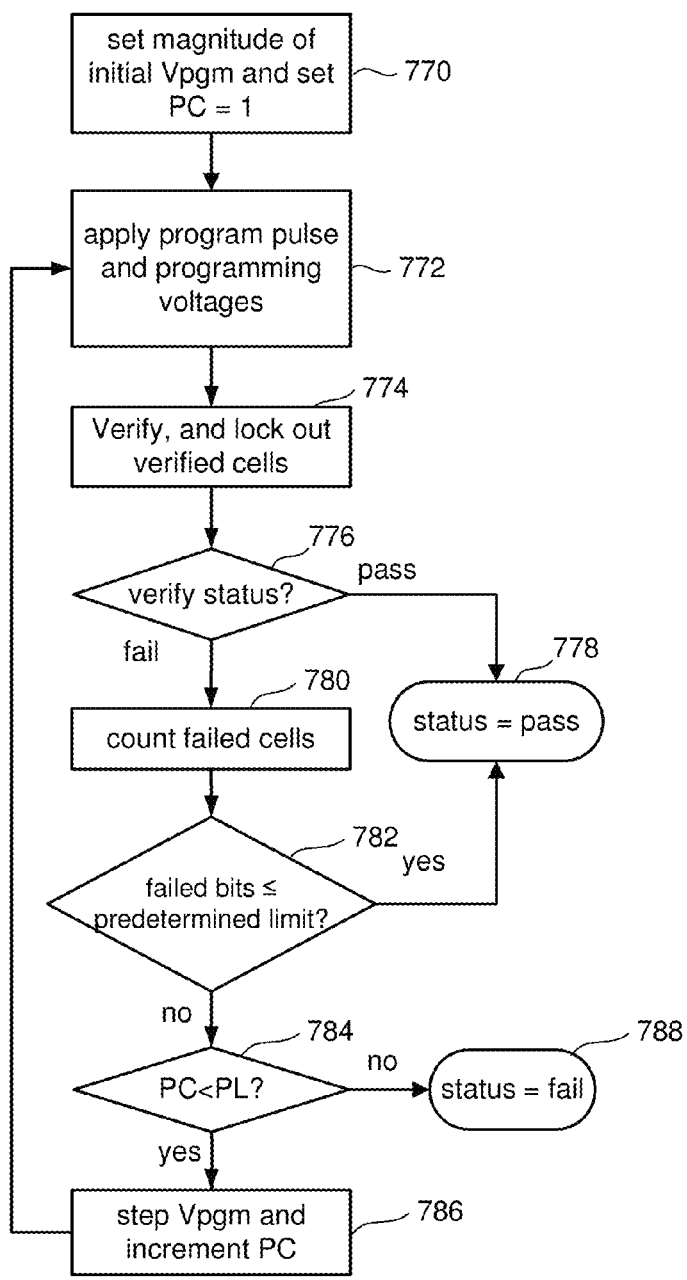
FIG. 7B is a flow chart describing one embodiment of a process for programming.

FIG. 7B is a flowchart describing one embodiment of a process for programming. The process of FIG. 7B is performed by the memory die in response to the steps of FIG. 7A (i.e., in response to the instructions, data and addresses from Controller 122). In one example embodiment, the process of FIG. 7B is performed on memory die 108 using the one or more control circuits discussed above, at the direction of state machine 112. The process of FIG. 7B can also be used to implement the full sequence programming discussed above. Additionally, the process of can be used to implement each phase of a multi-phase programming process.

Typically, the program voltage applied to the control gates (via a selected word line) during a program operation is applied as a series of program pulses. Between programming pulses are a set of verify pulses to perform verification. In many implementations, the magnitude of the program pulses is increased with each successive pulse by a predetermined step size. In step 770 of FIG. 7B, the programming voltage (Vpgm) is initialized to the starting magnitude (e.g., ~12-16V or another suitable level) and a program counter PC maintained by state machine 112 is initialized at 1. In step 772, a program pulse of the program signal Vpgm is applied to the selected word line (the word line selected for programming). In one embodiment, the group of memory cells being programmed concurrently are all connected to the same word line (the selected word line). The unselected word lines receive one or more boosting voltages (e.g., ~7-11 volts) to perform boosting schemes known in the art. If a memory cell should be programmed, then the corresponding bit line is grounded. On the other hand, if the memory cell should remain at its current threshold voltage, then the corresponding bit line is connected to Vdd to inhibit programming In step 772, the program pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 774, the appropriate memory cells are verified using the appropriate set of verify reference voltages to perform one or more verify operations. In one embodiment, the verification process is performed by applying the testing whether the threshold voltages of the memory cells selected for programming have reached the appropriate verify reference voltage.

In step 776, it is determined whether all the memory cells have reached their target threshold voltages (pass). If so, the programming process is complete and successful because all selected memory cells were programmed and verified to their target states. A status of "PASS" is reported in step 778. If, in 776, it is determined that not all of the memory cells have reached their target threshold voltages (fail), then the programming process continues to step 780.

In step 780, the system counts the number of memory cells that have not yet reached their respective target threshold voltage distribution. That is, the system counts the number of memory cells that have, so far, failed the verify process. This counting can be done by the state machine, the Controller, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 782, it is determined whether the count from step 780 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 778. In this situation, enough memory cells programmed correctly such that the few remaining memory cells that have not been completely programmed can be corrected using ECC during the read process. In some embodiments, step 780 will count the number of failed cells for each sector, each target data state or other unit, and those counts will individually or collectively be compared to a threshold in step 782.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, than the programming process continues at step 784 and the program counter PC is checked against the program limit value (PL). Examples of program limit values include 20 and 30; however, other values can be used. If the program counter PC is not less than the program limit value PL, then the program process is considered to have failed and a status of FAIL is reported in step 788. If the program counter PC is less than the program limit value PL, then the process continues at step 786 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 786, the process loops back to step 772 and another program pulse is applied to the selected word line so that another iteration (steps 772-786) of the programming process of FIG. 7B is performed.

In general, during verify operations and read operations, the selected word line is connected to a voltage (one example of a reference signal), a level of which is specified for each read operation (e.g., see read compare levels Vr1, Vr2, Vr3, Vr4, Vr5, Vr6, and Vr7, of FIG. 5) or verify operation (e.g. see verify target levels Vv1, Vv2, Vv3, Vv4, Vv5, Vv6, and Vv7 of FIG. 5) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

Figure 8:
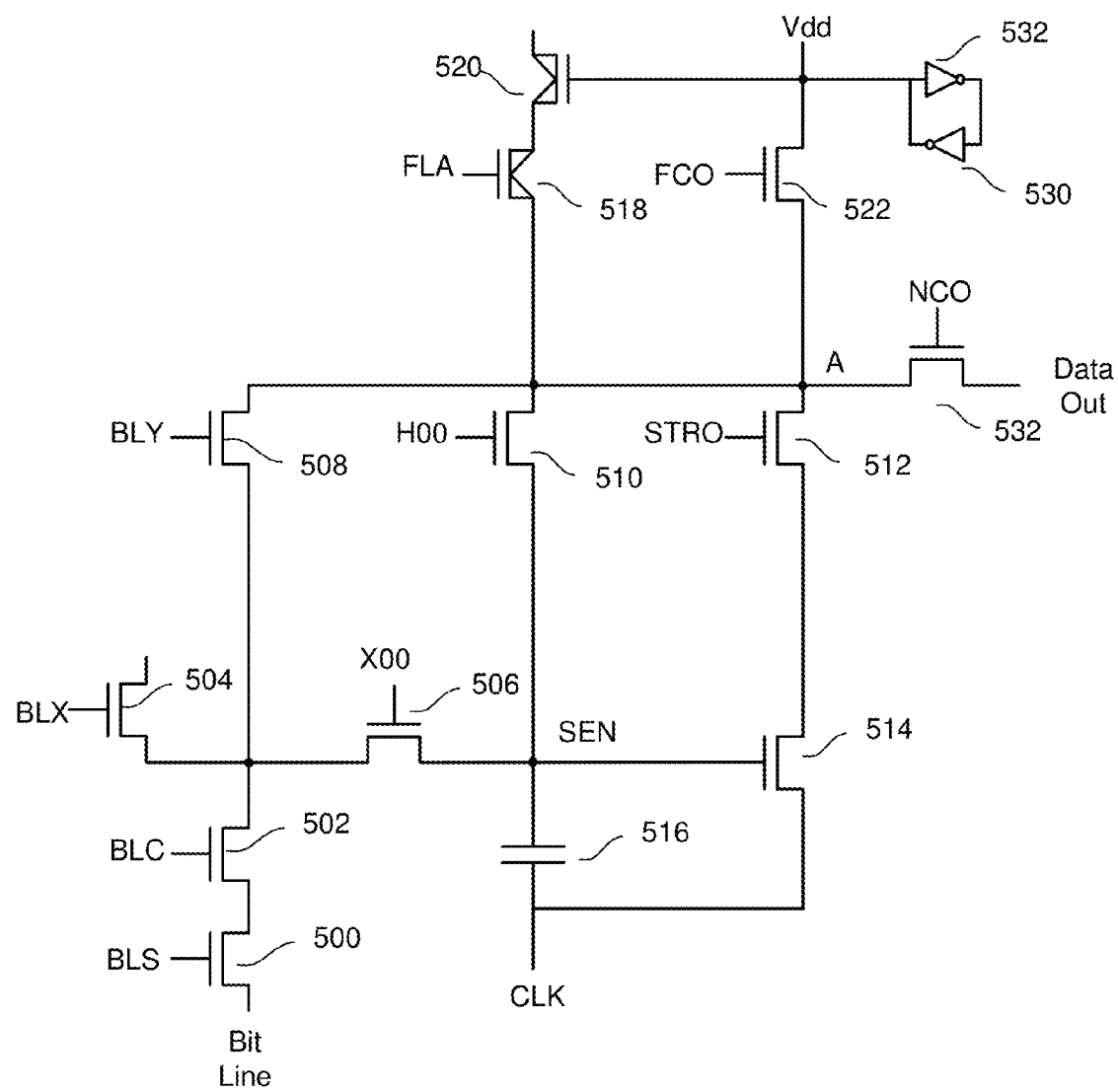
FIG. 8 is a schematic diagram of a circuit for a sense amplifier.

FIG. 8 is a schematic diagram of one example embodiment of a sense amplifier circuit that can be used to measure the conduction current of a memory cell during a read or verify operation. Each sense block SB1, SB2, . . . , SBp (see FIG. 2) includes multiple sense amplifier circuits. As described below, the circuit of FIG. 8 pre-charges a capacitor (or other charge storage device) to a pre-charge magnitude, discharges the capacitor through the memory cell for the duration of a sense time, and senses voltage at the capacitor after the sense time. The sense voltage will be indicative of whether the memory cells conducted the current being sensed for, which is indicative of whether the threshold voltage of the memory cell is greater than or less than threshold voltage being tested for. If the threshold voltage of the memory cell is greater than the threshold voltage being tested, then, during a verify operation, the memory cell will complete programming, as appropriate based on the processes described herein. FIG. 8 shows transistor 500 connected to the Bit Line and transistor 502. Transistor 500 receives the signal BLS at its gate, and is used to connect to or isolate the Bit Line. Transistor 502 receives the signal BLC at its gate, and is used as a voltage clamp. The gate voltage BLC is biased at a constant voltage equal to the desired Bit Line voltage plus the threshold voltage of transistor 502. The function of transistor 502, therefore, is to maintain a constant Bit Line voltage during a sensing operation (during read or verify), even if the current through the Bit Line changes.

Transistor 502 is connected to transistors 504, 506 and 508. Transistor 506 is connected to capacitor 516 at the node marked SEN. The purpose of transistor 506 is to connect capacitor 516 to Bit Line 500 and disconnect capacitor 516 from Bit Line 500 so that capacitor 516 is in selective communication with Bit Line 500. In other words, transistor 506 regulates the sense time. That is, while transistor 506 is turned on capacitor 516 can discharge through the Bit Line, and when transistor 506 is turned off capacitor 516 cannot discharge through the Bit Line. To control the sense time, the state machine 112 (optionally at the direction of Controller 122) controls transistor 506.

The node at which transistor 506 connects to capacitor 516 is also connected to transistor 510 and transistor 514. Transistor 510 is connected to transistors 508, 512 and 518. Transistor 518 is also connected to transistor 520. Transistors 518 and 520 are PMOS transistors while the other transistors of FIG. 5 are NMOS transistors. Transistors 510, 518, and 520 provide a pre-charging path to capacitor 516. A voltage (e.g. Vdd or other voltage) is applied to the source of transistor 520. By appropriately biasing transistors 510, 518 and 520, the voltage applied to the source of transistor 520 can be used to pre-charge capacitor 516. After pre-charging, capacitor 516 can discharge through the Bit Line via transistor 506 (assuming that transistors 500 and 502 are conducting).

The circuit of FIG. 8 includes inverters 530 and 532 forming a latch circuit. The output of inverter 532 is connected to the input of inverter 530 and the output of inverter 530 is connected to the input of inverter 532. as well as transistors 520 and 522. The input of inverter 532 will receive Vdd and the two inverters 530, 532 will act as a latch to store Vdd. The input of inverter 532 can also be connected to another value. Transistors 512 and 522 provide a path for communicating the data stored by inverters 530 and 532 to transistor 514. Transistor 522 receives the signal FCO at its gate. Transistor 512 receives the signal STRO at its gate. By raising or lowering FCO and STRO, a path is provided or cut off between the inverters 530, 532 and transistor (sensing switch) 514. The gate of transistor 514 is connected capacitor 516, transistor 506 and transistor 510 at the node marked SEN. The other end of capacitor 516 is connected to the signal CLK.

As discussed above, capacitor 516 is pre-charged via transistors 510, 518 and 520. This will raise the voltage at the SEN node to a pre-charge voltage level (Vpre). When transistor 506 turns on, capacitor 516 can discharge its charge through the Bit Line and the selected memory cell if the threshold voltage of the memory cell is below the voltage level being tested for. If the capacitor 516 is able to discharge, then the voltage at the capacitor (at the SEN node) will decrease.

The pre-charge voltage (Vpre) at the SEN node is greater than the threshold voltage of transistor 514; therefore, prior to the sense time, transistor 514 is on (conducting). Since transistor 514 is on during the sense time, then transistor 512 should be off. If the capacitor does not discharge during the sense time, then the voltage at the SEN node will remain above the threshold voltage of transistor 514 and the charge at the inverters 530, 532 can be discharged into the CLK signal when STRO turns on transistor 512. If the capacitor discharges sufficiently during the sense time, then the voltage at the SEN node will decrease below the threshold voltage of transistor 514; thereby, turning off transistor 914 and the data (e.g., Vdd) stored at inverters 530, 532 from being discharged through CLK. So testing whether the diodes 530, 532 maintain their charge or discharge will indicate the result of the verification process. In one embodiment, the result can be read at node A via transistor 534 (Data Out) by turning on transistor 534 gate signal NCO.

The pre-charge level of capacitor 516 (and, thus, the pre-charge voltage at node SEN) is limited by the current passing through transistor 510. The current that passes through transistor 510 is limited by the gate voltage H00. As such, the pre-charge voltage at node SEN is limited by the voltage H00 less the threshold voltage of transistor 510. With this arrangement, the system can regulate the pre-charge voltage at node SEN by regulating H00. A larger voltage at H00 results in a larger voltage at the SEN node when pre-charging. A lower voltage at H00 results in a lower voltage at the SEN node when pre-charging.

When the system performs a read or verify operation (both are sense operations), the voltage applied to the control gate of the cell may cause the channel (connected to the bit line) of the cell to conduct. If this happens, a capacitor is discharged through the channel, lowering in voltage as it discharges.

FIG. 9 is a timing diagram describing the behavior of various signals from FIG. 8. The signal BLS is at Vdd the entire time depicted and the signal BLC is at Vbl+Vsrc+Vth, where Vbl is the voltage of the Bit Line, Vsrc is the voltage of the source line and Vth is the threshold voltage of transistor 502. The signal FLA starts at Vss at t0 and goes to Vdd at t6. When the signal FLA is at Vss, the pre-charging path is regulated by transistor 510. At t0, the voltage of H00 is raised from ground to a pre-charge level. The raising of the voltage at H00 turns on transistor 510 and opens up the pre-charge path. The magnitude of the voltage at H00 is set. FIG. 9 shows H00 going to Vhoo. The signal H00 will stay at the pre-charge voltage (Vhoo) until time t1. While H00 is high, transistor 510 turns on and capacitor 516 will pre-charge between t0 and t1, as depicted by the voltage at SEN. At time t1, H00 is brought down to Vss and the pre-charging is completed.

The signal X00 is used to allow capacitor 516 to be in communication with the Bit Line so that the capacitor can discharge through the Bit Line and selected memory cell. At time t3, X00 is raised to Vblc+Vblx, where Vblc is the voltage of the signal BLC and Vblx is the voltage of the signal BLX (both discussed above). At time t4, the voltage at X00 is lowered to Vss. Between times t3 and t4, known as the sense time, capacitor 516 will be in communication with the Bit Line in order to allow it to discharge through the Bit Line and the selected memory cell (depending on the threshold voltage of the selected memory cell). The signal CLK is raised to Vblx at time t2 and lowered back down to Vss at time t5 to prevent any fighting conditions in the circuit and to allow proper discharge of capacitor 516.

As discussed above, because H00 is raised between t0 and t1, capacitor 516 (and SEN node) will charge up between t0 and t1 (the pre-charge). This is depicted in FIG. 9 with the SEN node charging from Vss to Vpre. The solid line for Vpre represents an example pre-charging of the node SEN (and capacitor 516) in response to Vh00 being applied to the gate of transistor 510.

When X00 is raised up at t3, capacitor 516 can initially pre-charge the bit line and then discharge through the Bit Line (if the threshold voltage is at the appropriate level). As depicted in FIG. 9 between t3 and t4, the voltage at the SEN node can will dissipate from Vpre to Vpost_con if the memory cell turns on (conducts) because its threshold voltage is less than or equal to the voltage being applied to its control gate. If the threshold voltage for the memory cell being tested is higher than the voltage applied to its control gate, capacitor 516 will not discharge and the voltage will remain at Vpre. The period between t3 and t4 is the sense time and can be adjusted, as described above.

FIG. 9 shows that the signal FCO is raised to Vdd at t7 and lowered to Vss at T9. The signal STRO is raised to Vdd at t8 and lowered at t9. Between times t8 and t9, there is a path between the inverters 530, 532 and transistor 514. If the voltage at the node SEN is greater than the threshold voltage of transistor 514, then there will be a path from the inverters 530, 532 to CLK and the data at the inverters 530, 532 will dissipate through the signal CLK and through the transistor 514. If the voltage at the node SEN is lower than threshold voltage of transistor 514 (e.g. if the capacitor discharged), then transistor 514 will turn off and the voltage stored by the inverters 530, 532 will not dissipate into CLK. FIG. 6 shows the voltage level at node A at Vdd. If the voltage of the capacitor does not dissipate (e.g., due to not enough current flowing because the threshold voltage of the selected memory cell is greater than the voltage being tested for), then transistor 514 will remain on and the voltage at node A will dissipate to Vss (as depicted by the dashed line). If the voltage of the capacitor does dissipate (e.g., due to sufficient current flowing because the threshold voltage of the selected memory cell is below the voltage being tested for), then transistor 514 will turn off and the voltage at node A will remain at Vdd (as depicted by the solid line). The output of node A is provided to the Data Out signal via transistor 534 by applying Vdd to the signal NCO.

FIG. 10 is a flow chart describing a sensing operation performed according to the timing diagram of FIG. 9. In step 602, the appropriate verify reference voltage (e.g., Vv1, Vv2, Vv3, Vv4, Vv5, Vv6, or Vv7) or the appropriate read reference voltage (e.g., Vr1, Vr2, Vr3, Vr4, Vr5, Vr6, or Vr7) is applied is applied to the selected word line. The selected word line is connected to the memory cells being programmed and verified. The bit lines connected to the memory cells being programmed and verified are charged to a pre-determined pre-charge level. In step 604, all of the SEN nodes are pre-charged. In step 606, capacitors in the sense amplifiers (e.g. capacitor 516) are provided a path to discharge through the memory cells (see SEN node t5-t6 of FIG. 6). After a predetermined time period, referred to as the "sense time" or "strobe time" the voltage of the capacitor 516 (or the SEN node) is sampled as described above to see whether the respective memory cell(s) conducted in step 608. As described above, the verification process is performed simultaneously for thousands of memory cells connected to the same word line and different bit lines.

Memory systems often use Error Correction Codes (ECC) to protect data form corruption. Many ECC coding schemes are well known in the art. These conventional error correction codes are especially useful in large scale memories, including flash (and other non-volatile) memories, because of the substantial impact on manufacturing yield and device reliability that such coding schemes can provide, rendering devices that have a few non-programmable or defective cells as useable. Of course, a tradeoff exists between the yield savings and the cost of providing additional memory cells to store the code bits (i.e., the code "rate"). As such, some ECC codes are better suited for flash memory devices than others. Generally, ECC codes for flash memory devices tend to have higher code rates (i.e., a lower ratio of code bits to data bits) than the codes used in data communications applications (which may have code rates as low as 1/2). Examples of well-known ECC codes commonly used in connection with flash memory storage include Reed-Solomon codes, other BCH codes, Hamming codes, and the like. Sometimes, the error correction codes used in connection with flash memory storage are "systematic," in that the data portion of the eventual code word is unchanged from the actual data being encoded, with the code or parity bits appended to the data bits to form the complete code word.

The particular read parameters for a given error correction code include the type of code, the size of the block of actual data from which the code word is derived, and the overall length of the code word after encoding. For example, a typical BCH code applied to a sector of 512 bytes (4096 bits) of data can correct up to four error bits, if at least 60 ECC or parity bits are used. Reed-Solomon codes are a subset of BCH codes, and are also commonly used for error correction. For example, a typical Reed-Solomon code can correct up to four errors in a 512 byte sector of data, using about 72 ECC bits. In the flash memory context, error correction coding provides substantial improvement in manufacturing yield, as well as in the reliability of the flash memory over time.

In some embodiments, the Controller 122 receives host data, also referred to as information bits, that is to be stored in non-volatile three dimensional memory structure 126. The informational bits are represented by the matrix i=[1 0] (note that two bits are used for example purposes only, and many embodiments have code words longer than two bits). An error correction coding process (such as any of the processes mentioned above or below) is implemented in which parity bits are added to the informational bits to provide data represented by the matrix or code word v=[1 0 1 0], indicating that two parity bits have been appended to the data bits. Other techniques can be used that map input data to output data in more complex manners. For example, low density parity check (LDPC) codes, also referred to as Gallager codes, can be used. More details about LDPC codes can be found in R. G. Gallager, "Low-density parity-check codes," IRE Trans. Inform. Theory, vol. IT-8, pp. 21 28, Jan. 1962; and D. MacKay, Information Theory, Inference and Learning Algorithms, Cambridge University Press 2003, chapter 47. In practice, such LDPC codes are typically applied to multiple pages encoded across a number of storage elements, but they do not need to be applied across multiple pages. The data bits can be mapped to a logical page and stored in the non-volatile storage 126 by programming one or more memory cells to one or more data states, which corresponds to v.

In one possible implementation, an iterative probabilistic decoding process is used which implements error correction decoding corresponding to the encoding implemented in the Controller 122. Further details regarding iterative probabilistic decoding can be found in the above-mentioned D. MacKay text. The iterative probabilistic decoding attempts to decode a code word read from the memory by assigning initial probability metrics to each bit in the code word. The probability metrics indicate a reliability of each bit, that is, how likely it is that the bit is not in error. In one approach, the probability metrics are logarithmic likelihood ratios LLRs which are obtained from LLR tables. LLR values are measures of the reliability with which the values of various binary bits read from the storage elements are known.

The LLR for a bit is given by $$Q = \log_2 \frac{P(v=0|Y)}{P(v=1|Y)},$$

where P(v=0|Y) is the probability that a bit is a 0 given the condition that the state read is Y, and P(v=1|Y) is the probability that a bit is a 1 given the condition that the state read is Y. Thus, an LLR>0 indicates a bit is more likely a 0 than a 1, while an LLR<0 indicates a bit is more likely a 1 than a 0, to meet one or more parity checks of the error correction code. Further, a greater magnitude indicates a greater probability or reliability. Thus, a bit with an LLR=63 is more likely to be a 0 than a bit with an LLR=5, and a bit with an LLR=−63 is more likely to be a 1 than a bit with an LLR=−5. LLR=0 indicates the bit is equally likely to be a 0 or a 1.

An LLR value can be provided for each of the bit positions in a code word. Further, the LLR tables can account for the multiple read results so that an LLR of greater magnitude is used when the bit value is consistent in the different code words.

Controller 122 receives the code word Y1 and the LLRs and iterates in successive iterations in which it determines if parity checks of the error encoding process have been satisfied. If all parity checks have been satisfied, the decoding process has converged and the code word has been successfully error corrected. If one or more parity checks have not been satisfied, the decoder will adjust the LLRs of one or more of the bits which are inconsistent with a parity check and then reapply the parity check or next check in the process to determine if it has been satisfied. For example, the magnitude and/or polarity of the LLRs can be adjusted. If the parity check in question is still not satisfied, the LLR can be adjusted again in another iteration. Adjusting the LLRs can result in flipping a bit (e.g., from 0 to 1 or from 1 to 0) in some, but not all, cases. In one embodiment, another parity check is applied to the code word, if applicable, once the parity check in question has been satisfied. In others, the process moves to the next parity check, looping back to the failed check at a later time. The process continues in an attempt to satisfy all parity checks. Thus, the decoding process of Y1 is completed to obtain the decoded information including parity bits v and the decoded information bits i.

Once data is programmed into the memory cells, the data is available to be read. In one embodiment, the memory system will read the data in response to a request from the host 140. As with most electronic devices, performance is important to users. Therefore, there is a desire to improve read performance. One example of a performance improvement feature includes shortening the sense time during the read process. With shorter sense times, the read process will be shortened in time. In one embodiment, the memory dies will implement a standard read process and a "fast read process." The fast read process includes the shorter sense time. In one example implementation, the standard read process has a sense time of 80 μsec and the fast read process has a sense time of 10 μsec. Note that Controller 122 has the option of turning on or off the fast read process (ie choosing between the standard read process and the fast read process).

While shortening the sense time can reduce the time needed to perform a read process, it may also run the risk of causing more errors in the data. While these errors may be corrected using the error correction process, the above-described decoding process will take longer to resolve (decode) the code words into user data. In general, if the number of errors in data sensed increases, then the ECC decoding process could take more time to complete. It is possible that the increase in decoding time may cancel out or be larger than the time savings from shortening the sense time, Therefore, it is proposed that Controller 122 and/or other of the one or more control circuits be configured to selectively use fast read process in those situations when overall system performance will be improved.

In one embodiment, bit error rate and temperature are used to choose between the standard read process and the fast read process. Bit error rate is an indication of the number of bits that were sensed incorrectly and had to be changed by the error correction process during a reading process. As bit error rate increases, decoding time also increase. Therefore, a determination of whether to use a fast read process will take into account the expected bit error rate. As temperature increases, the number of sense errors will also increase. Therefore, a determination of whether to use a fast read process will take into account temperature information. Many memory systems may account for temperature at time of programming and therefore, may use the difference in temperature from the time of programming to the time of reading when choosing whether to use a fast read process. For example, a big change in temperature may lead to more errors when sensing which suggests to use the standard read process rather than the fast read process.

FIG. 11 is a flow chart describing one embodiment of a process for reading that uses bit error rate information and temperature information to decide whether to use the standard read process or the fast read process. The process of FIG. 11 can be performed by any one or combination of the one or more control circuits discussed above. For example, the process of FIG. 11 can be performed by and/or at the direction of Controller 122 or state machine 112. In step 802 of FIG. 11, the one or more control circuits choose a read process to read data including determining whether to use a first read process with slower sense time or a second read process with faster sense time based on bit error rate information and temperature information. In step 804, the one or more control circuits cause reading of the data from non-volatile memory cells using the determined read process.

FIGS. 12-19 describe more details of a set of example implementations of the process of FIG. 11. In one embodiment, after programming a block, a sample of that block is read. For example, all of the memory cells connected to one or more word lines in a block can be read and the system will determine a bit error rate. Based on that bit error rate, the system will assign that block to a BER Region that the system expects to experience the next time that block is read. Thus, the BER Region, which is a range of bit error rates, represents previously measured bit error rate information. In one example embodiment, the one or more control circuits will maintain a table of bit error rate regions, as depicted in FIG. 12. For example, Controller 122 can store the table of FIG. 12. As can be seen, the table of FIG. 12 has two columns: the left-hand column indicates identification of the bit error region and the right hand column indicates the range of bit error rates for that bit error rate region ("BER Region").

In some embodiments, blocks of memory that are assigned the same BER Region are grouped together. This grouping of blocks is called a Time Tag. In some embodiments, blocks that have a similar bit error rate and similar read parameters are combined into a common Time Tag. The system will maintain a table of Time Tags. For example, FIG. 13 is an example table of Time Tags that can be stored by Controller 122 or memory die 108. The table of FIG. 13 has four columns. The first column indicates a unique identification for the Time Tags (Time Tag UID). The second column (CVD Read Parameters) indicates the read parameters (e.g., AR3, BR3, CR3, DR3, ER3, FR3, GR3 . . . ). The read parameters are various parameters used as part of the ECC decoding process, as well as indications of the various read compare/reference voltages (e.g. Vr1, Vr2, Vr3, Vr4, Vr5, Vr6, and Vr7) and/or verify compare/reference voltages (e.g., Vv1, Vv2, Vv3, Vv4, Vv5, Vv6, and Vv7) discussed above. The third column indicates the target BER Region assigned to that Time Tag. The fourth column indicates the Temperature Region. In one embodiment, the Temperature Region is the temperature sensed at the time the blocks of the Time Tag were programmed In other embodiments, the temperature region could be a range of temperatures which includes the temperature sensed at the time of programming the blocks.

Figure 14:
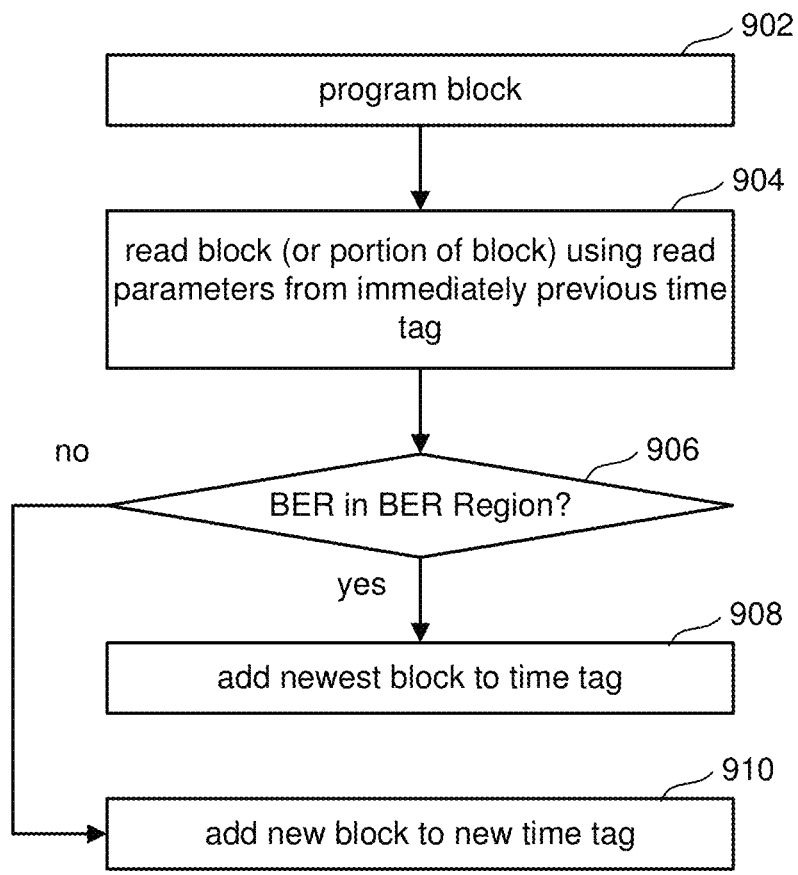
FIG. 14 is a flow chart describing one embodiment of a process for adding a block to a time tag, or grouping of blocks sharing common read parameters.

FIG. 14 is a flow chart describing one embodiment of a process for adding a block to a Time Tag, or otherwise forming groups of blocks sharing common read parameters. The process of FIG. 14 can be performed by various combinations of the one or more control circuits. In one embodiment, the process of FIG. 14 is performed by and/or at the direction of Controller 122. In step 902, Controller 122 (or another of the one or more control circuits) causes the block to be programmed. For example, the processes of FIGS. 7A and 7B can be used one or multiple times. In step 904, the just-programmed block is read back. In one embodiment, only a subset of the block is read. For example, all (or a subset of) memory cells connected to one or multiple word lines can be read. The read process for step 904 will include using the read parameters from the immediately previous created Time Tag. Step 904 includes sending read instructions to memory die 108, having memory die 108 sense the data and transmit that data back to Controller 122. Additionally, Controller 122 will perform the error correction decoding process, as discussed above and known the art. As part of the successful process of decoding, Controller 122 calculates the bit error rate. In step 906, Controller 122 determines whether the bit error rate calculated in the successful read operation of step 904 is in the BER Region of the immediately previous Time Tag. If so, the block that was just programmed and read back is added to that immediately previous Time Tag in step 908. If the BER calculated in step 904 is not in the BER Region for the immediately previous Time Tag, then in step 910 the block is added to a new Time Tag. In this manner, the system always tries to add a newly programmed block to the currently opened Time Tag. If that is not possible because the bit error rate is outside the BER Region for that currently opened Time Tag, then a new Time Tag is created. Additionally, the BER Region of a Time Tag is based on a measured bit error rate from a previously successful read operation.

Figure 15:
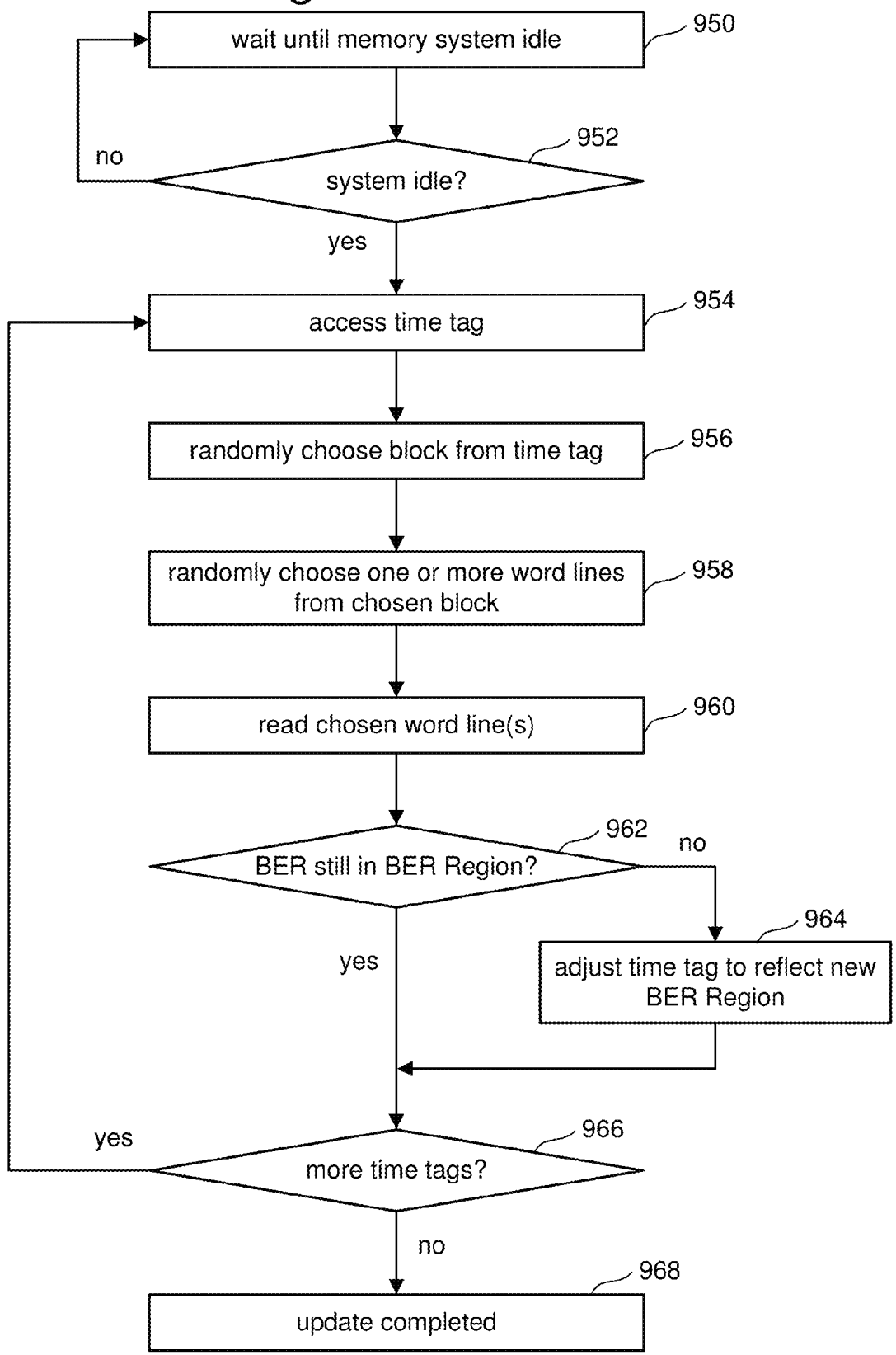
FIG. 15 is a flow chart describing one embodiment of a process for updating time tags.

FIG. 15 is a flow chart describing one embodiment for a process for updating Time Tags. The process of FIG. 15 can be performed by various combinations of the one or more control circuits. In one embodiment, the process of FIG. 15 is performed by and/or at the direction of Controller 122. In step 950, Controller 122 (or other of the one or more control circuits) waits until the memory system (or a specific memory die 108) is idle. If the system is not idle (step 952), then Controller 122 continue to wait (step 950). When the system is idle (step 952), then Controller 122 accesses one of the Time Tags from the data structure of FIG. 14. In step 956, Controller 122 randomly chooses a block from that Time Tag. In step 958, Controller 122 randomly chooses one or more word lines from that chosen block. In step 960, the chosen word lines will be read. For example, all the memory cells connected to the chosen word lines will be read by having memory die 108 sense the data stored in those memory cells and transmit that data back to Controller 122. As part of step 960, Controller 122 use the error correction decoding process to decode the code words read and determine the bit error rate. In step 962, Controller 122 determines whether the bit error rate determined in step 960 is in the BER Region for the Time Tag. If so, then no changes need to be made and the process continues to step 966. If there are more Time Tags to be tested, then the process loops back to step 954 and chooses another Time Tag. If all other Time Tags have been tested in this particular iteration of the process of FIG. 15, then the update is completed (step 968). If in step 962, the measured bit error rate from step 960 is outside the BER Region for the Time Tag, then in step 964 Controller 122 adjust the Time Tag by changing the BER Region associated with that Time Tag. For example, the table of FIG. 13 is updated to include a different Target BER Region. In an alternative embodiment, the block with the bit error rate outside the BER Region will be moved to a new Time Tag that will be assigned BER Region matching the bit error rate determined in step 960. In another alternative, if the bit error rate for a block is outside the BER Region for that block's Time Tag, then that block will be moved to another existing Time Tag that has a BER Region that includes the measured bit error rate for step 960.

Figure 16:
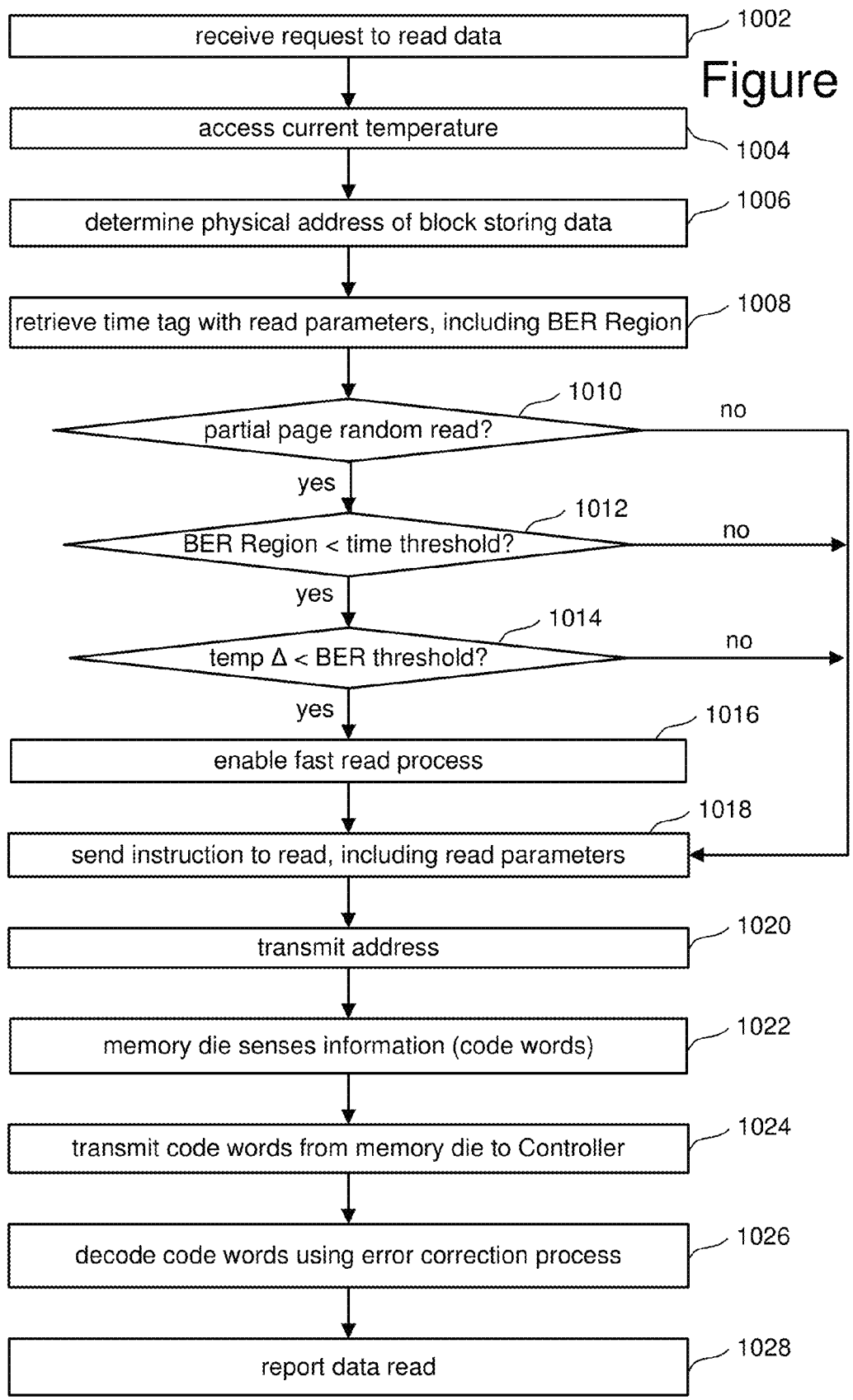
FIG. 16 is a flow chart describing one embodiment of a process for reading.

FIG. 16 is a flow chart describing one embodiment of a process for reading that uses the BER Regions and Time Tags discussed above. The process of FIG. 16 can be performed by various combinations of the one or more control circuits. In one embodiment, the process of FIG. 16 is performed by and/or at the direction of Controller 122. In step 1002, Controller 122 receives a request to read data from a host or other computing device. In step 1004, Controller 122 accesses the current temperature or other information indicative of current temperature. This can be performed by a temperature detection circuit 113 on memory chip 108 (and transmitted to Controller 122), on Controller 122, or a temperature sensor elsewhere in the system. In one embodiment, the temperature accessed in step 1004 is the temperature at the memory die and/or at the memory structure (or at the block being read). In step 1006, Controller 122 determines the physical address of the block storing the data requested to be read. In step 1008, Controller 122 retrieves the Time Tag for the block determined in step 1006. The Time Tag includes ECC and read parameters, BER Region and temperature at time of programming.

In one embodiment, data is programmed a page at a time. In one example implementation, a page can be all memory cells connected to a word line in a block. In other embodiment, a block can have multiple pages. In one example, one page is 16K bytes. In one embodiment, the system can read an entire page at a time or a portion of a page. When the system reads only a portion of the page it is referred to as a partial page random read. In one embodiment, the fast read process will only be used for partial page random reads, and not for full page reads. Therefore, in step 1010, Controller 122 determines whether the requested read is for a partial page random read. If not, the process skips to 1018 (discussed below). If the requested data is for a partial page random read, then in step 1012, Controller 122 determines whether the BER Region for the Time Tag for the data being read is less than a BER threshold. In one embodiment, using simulation, actual die testing and/or device characterization, it can be determined for this particular memory implementation or manufactured memory what acceptable bit error rates can be used with the fast read process. In one embodiment, the BER threshold is the highest bit error rate that can be used with the feast read process before the fast read process start to take longer than the standard read process. In another embodiment, the BER threshold is the highest bit error rate that will be tolerated for using the fast read process.

If the BER Region of the Time Tag for the data currently being read is less than that BER threshold (step 1012) then it is still possible to use the fast read. Therefore, the process will continue at step 1014, in which case the Controller 122 determines whether temp Δ is less than a temperature threshold. In one embodiment, temp Δ is the difference between the current temperature measured or accessed in step 1004 and the temperature at the time of programming (stored with the Time Tag). Therefore, step 1014 determines whether the difference between the current temperature and the temperature at the time of programming is less than the temperature threshold. If so, then Controller 122 knows that this is a partial page random read, BER Region is less than a BER threshold and temp Δ is less than a temperature threshold; therefore, Controller 122 enables the fast read process for the upcoming read in step 1016.

In step 1018, Controller 122 sends instructions to the appropriate memory die 108 to perform the sensing for the read operation(s). The set of instructions includes the read parameters from the Time Tag. In one embodiment, step 106 includes setting a flag in Controller 122 so that when the instructions are sent in sentence step 1018, Controller 122 instructs the memory die 108 to use the fast read process. Note that if the system determines in step 1010 that it was not a partial page random read, or if the system determines in step 1012 that the BER Region is not less than the BER threshold or the differential temperature is not less than the temperature threshold, then step 1016 will be skipped and the process will move directly to step 1018, in which case Controller 122 will send instructions to the memory die 108 to perform the read process using the standard read process. In step 1020, Controller 122 transmit to the memory die the address for the block to be read. In step 1022, memory die 108 senses the information from the addressed memory cells. These are the code words. In step 1024, the code words are transmitted from the memory die 108 to Controller 122. In step 1026, Controller 122 decode the code words using the error correction process. In step 1028, the data read will be reported to the requester of that data.

In some embodiments, the fast read process can be used for a partial page random read or a full page read. In that embodiment, step 1010 will be removed from the process of FIG. 16. Therefore, step 1008 will go directly to step 1012.

Figure 17:
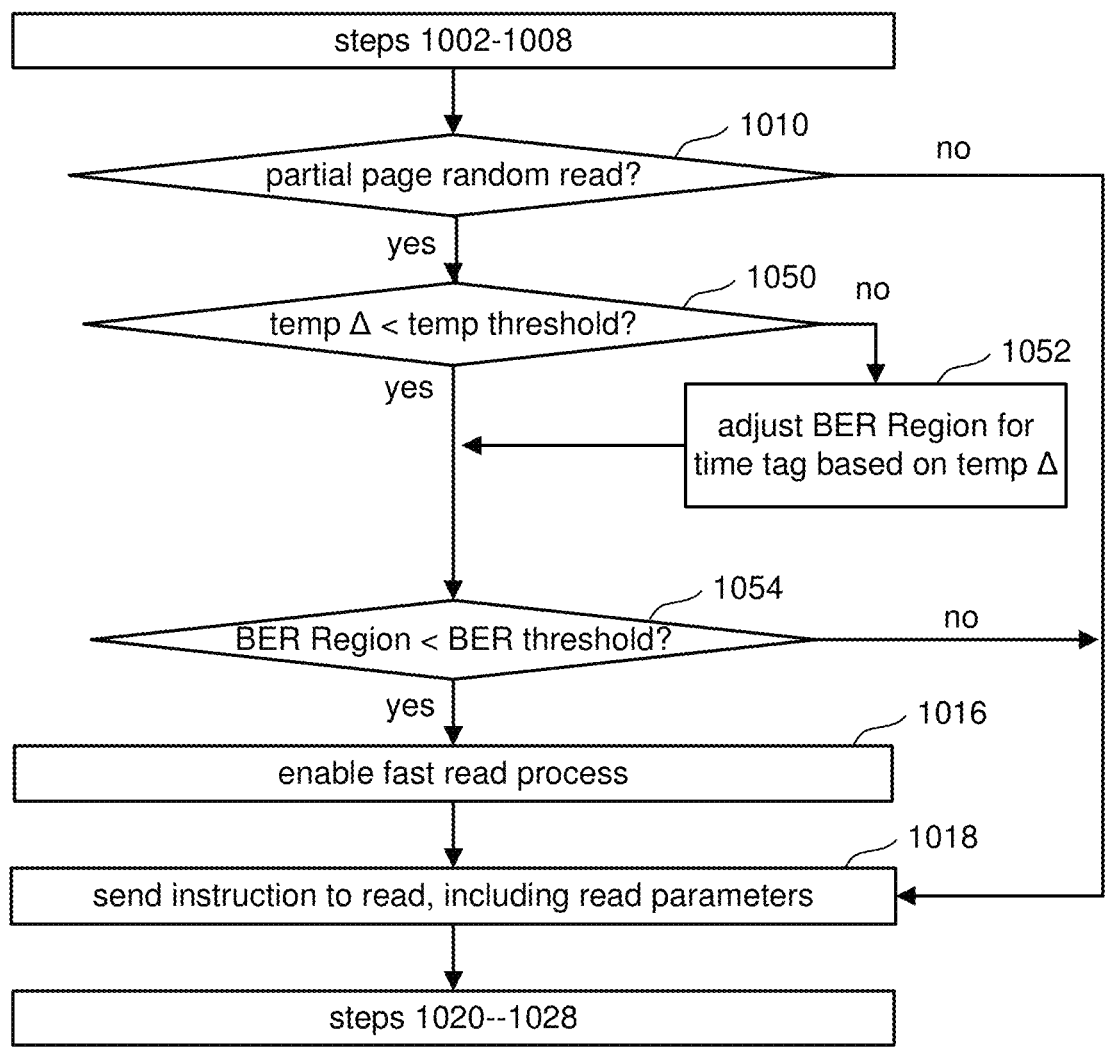
FIG. 17 is a flow chart describing one embodiment of a process for reading.

FIG. 17 is a flow chart describing one embodiment of a process for reading data. The process of FIG. 17 is an alternative embodiment to the process of FIG. 16. The process of FIG. 17 can be performed by various combinations of the one or more control circuits. In one embodiment, the process of FIG. 17 is performed by and/or at the direction of Controller 122. The process of FIG. 17 starts out with the same steps 1002-1010 of FIG. 16. Similarly, if it is not a partial page random read, the process will skip to step 1018. However, in the embodiment of FIG. 17 if the read is for a partial page random read, the process continues at step 1050 in which case the system determines whether the difference between the current temperature and the temperature at the time of programming is less than the temperature threshold. If not, that means that the temperature has changed by a significant amount and in step 1052, the BER Region for the Time Tag of the data being read is adjusted based on the difference in temperature. The larger the difference in temperature the bigger the change of BER Regions (to a BER Region with higher bit error rates). For example, with a large change in temperature, it is expected that the bit error rate will increase. After step 1052, Controller 122 determines in step 1054 whether the BER Region is less than the bit error rate threshold. The BER Region tested in step 1054 is the BER Region after the adjusting of the BER Region in step 1052. Therefore FIG. 17 includes a process where if there has been a large temperature differential, the system (i.e., the Controller 122) will choose a new BER Region for the current Time Tag to reflect the anticipated increase in bit error rate. If the BER Region is less than the bit error rate threshold, then Controller 122 enables the fast read process in step 1016 and the process continues with steps 1018-1028. If the BER Region is not less than the bit error rate threshold, then step 1016 is skipped, the system will use the standard read process and will continue with steps 1018-1028.

If the difference between the current temperature and the temperature at the time of programming is less than the temperature threshold (step 1050), then step 1052 is skipped and the process continues at step 1054 using the BER Region without any adjustment.

Figure 18:
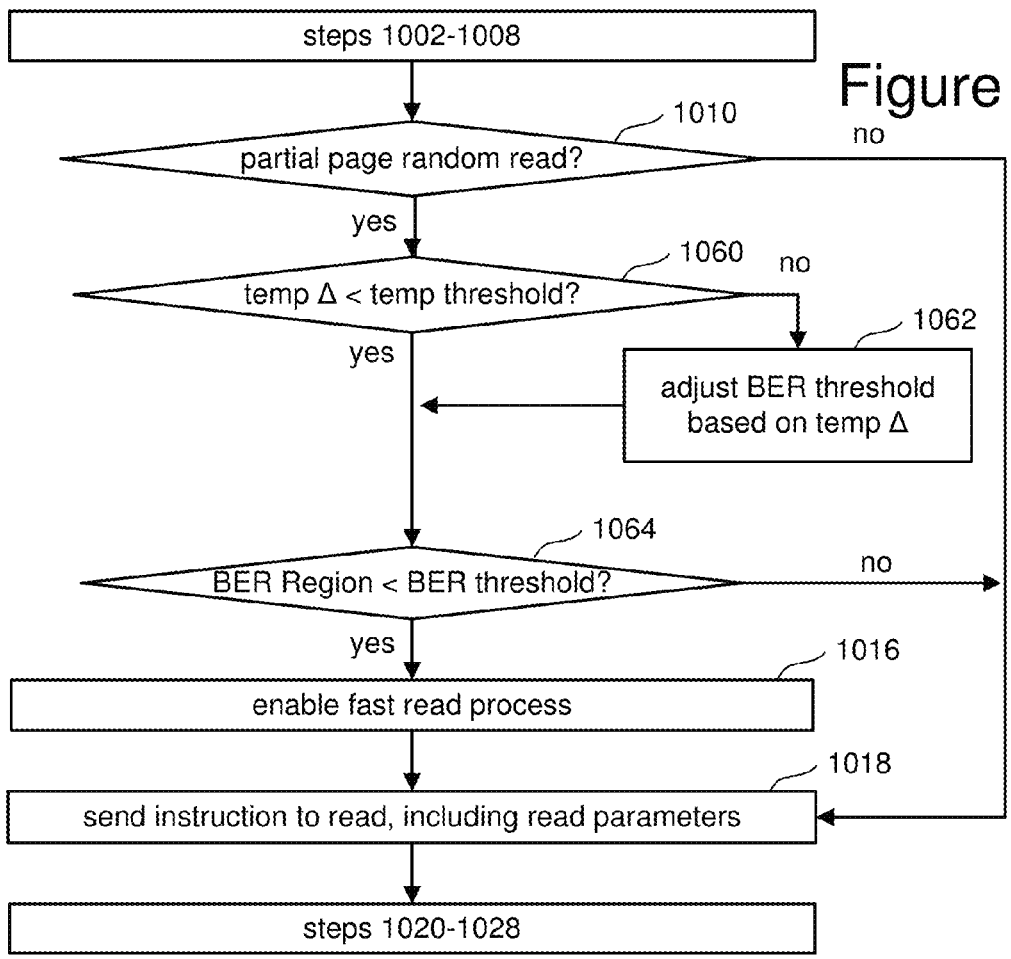
FIG. 18 is a flow chart describing one embodiment of a process for reading.

FIG. 18 is a flow chart describing one embodiment of a process for reading data. The process in FIG. 18 is an alternative embodiment to the process of FIG. 16. The process of FIG. 18 can be performed by various combinations of the one or more control circuits. In one embodiment, the process of FIG. 18 is performed by and/or at the direction of Controller 122. The process of FIG. 18 starts out with the same steps 1002-1010 of FIG. 16. Similar to FIG. 16, if the current read is not a partial page random read, then the process skips to step 1018 and proceeds with the standard read process. After step 1018, the process of FIG. 18 continues with steps 1020-1028.

If the current read is for a partial page random read, then in step 1060 the Controller 122 determines whether the difference between the current temperature and the temperature at the time of programming is less than the temperature threshold. If so, then the process continues at step 1064 and Controller 122 determines whether the BER Region is less than the BER threshold. If so, the process continues to step 1016 to enable the fast read process and continue with steps 1018-1028; otherwise, step 1016 is skipped and the process continues at steps 1018-1028 which will includes the standard the read process. If in step 1060, it is determined that the difference between the current temperature and the temperate at the time of programming is not less than the temperature threshold, then Controller 122 will adjust the BER threshold based on that difference in temperature. Again, a large difference in temperature indicates that there is likely to be a larger bit error rate. Therefore, the system may adjust (e.g., lower) the BER threshold used to be tested against the BER Region for the current Time Tag.

Figure 19:
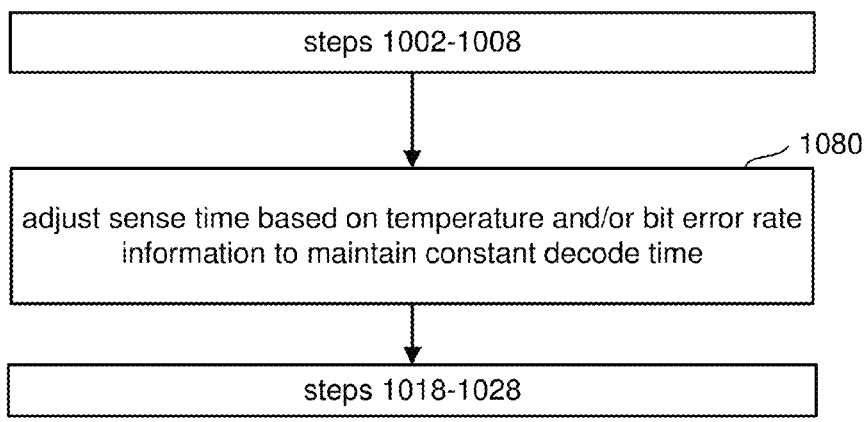
FIG. 19 is a flow chart describing one embodiment of a process for reading.

FIG. 19 is a flow chart describing one embodiment for reading data. The process of FIG. 19 is an alternative embodiment to the process of FIG. 16. The process of FIG. 19 can be performed by various combination of the one or more control circuits. In one embodiment, the process of FIG. 19 is performed by and/or at the direction of the Controller 122. In the embodiment of FIG. 19, Controller 122 (or another of the one or more control circuits) will configure the read process by calculating an appropriate sense time based on temperature information and/or bit rate information to (optionally) maintain a constant decode time during the read operation. In one embodiment, Controller 122 can choose between the standard read process and the fast read process, where the fast read process is configured to have its sense time calculated and set based on temperature and/or bit error rate information. In another embodiment, the standard read process is configured to have its sense time calculated and set based on temperature and/or bit error rate information The process of FIG. 19 starts out with step 1002-1008 from FIG. 16. In step 1080, the sense time is adjusted and/or calculated based on temperature information and/or bit error rate information to (optionally) maintain constant decode time. The temperature information used in step 1080 can be current temperature or the difference between current temperature and the temperature at the time of programming the blocks in the Time Tag. The bit rate information can include the BER Region of the current Time Tag or a bit error rate calculated from sampling a portion of the data. After step 1080, the process continues with steps 1018-1028 of FIG. 16. In another embodiment, the sense time of the fast read process can be adjusted based on bit error information, such as the BER Region assigned to the Time Tag for the block being read.

The above-described embodiments achieve a reduction in latency when responding to certain read requests.

One embodiment includes a non-volatile storage apparatus, comprising a plurality of non-volatile memory cells and one or more control circuits in communication with the memory cells. The one or more control circuits are configured to choose a read process to read data including determining whether to use a first read process with slower sense time or a second read process with faster sense time based on bit error rate information and temperature information. The one or more control circuits are configured to cause reading of the data from non-volatile memory cells using the determined read process.

In one example, the one or more control circuits determine to use the first read process with slower sense time if a difference between current temperature and temperature at time of programming is greater than a threshold. In another example, the one or more control circuits determine to use the first read process with slower sense time if a current temperature is greater than a threshold.

One embodiment includes a method of reading from non-volatile storage, comprising: identifying error information associated with particular data stored in a non-volatile memory structure; obtaining temperature data related to temperature at the non-volatile memory structure; choosing a read process from a plurality of different read processes based on the error information and the temperature data; and causing reading of the particular data using the chosen read process.

One embodiment includes an apparatus, comprising: a first communication interface configured to communicate with a computing device; a second communication interface configured to communicate with one or more memory dies; and one or more processors connected with the first communication interface and the second communication interface. The one or more processors are configured to receive a request to read data via the first communication interface and identify a physical block in one of the memory dies that is storing the data. The one or more processors are configured to identify read parameters associated with the physical block. The read parameters include bit error rate information. The one or more processors are configured to determine whether to use a faster read process or slower read process based on the bit error rate information and temperature data. The one or more processors are configured to cause reading of the data (via the second communication interface) from the physical block using the determined read process and at least a subset of the read parameters.

One embodiment includes a non-volatile storage apparatus, comprising a three dimensional memory structure and means for reading the memory cells. The three dimensional memory structure includes bit lines, word lines and a plurality of non-volatile memory cells arranged in blocks. Memory cells in a common block share bit lines and word lines. The means for reading the memory cells includes means for performing a first read process with a slower sense time, means for performing a second read process with a faster sense time, and means for choosing to use the first read process or the second read process based on temperature and bit error rate.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage apparatus, comprising:
a plurality of non-volatile memory cells; and
one or more control circuits in communication with the memory cells, the one or more control circuits are configured to choose a read process to read data including determining whether to use a first read process with slower sense time or a second read process with faster sense time based on bit error rate information and temperature information, the one or more control circuits are configured to cause reading of the data from non-volatile memory cells using the determined read process.

2. A non-volatile storage apparatus according to claim 1, wherein:
the one or more control circuits determine to use the first read process with slower sense time if a difference between current temperature for a memory die and temperature at time of programming for the memory die is greater than a threshold, the non-volatile memory cells are on the memory die.

3. A non-volatile storage apparatus according to claim 1, wherein:
the one or more control circuits determine to use the first read process with slower sense time if a current temperature is greater than a threshold.

4. A non-volatile storage apparatus according to claim 1, wherein:
the non-volatile memory cells are on a memory die; and
the memory die includes a temperature detection circuit, the one or more control circuits are configured to choose the read process to read data based on output of the temperature detection circuit.

5. A non-volatile storage apparatus according to claim 1, wherein:
the one or more control circuits are configured to choose the read process to read data based on comparing previously measured bit error rate information to a bit error rate threshold, the one or more control circuits are configured to adjust the bit error rate threshold based on current temperature.

6. A non-volatile storage apparatus according to claim 1, wherein:
the one or more control circuits are configured to choose the read process to read data based on comparing expected bit error rate to a bit error rate threshold, the one or more control circuits are configured to adjust the expected bit error rate based on current temperature.

7. A non-volatile storage apparatus according to claim 1, wherein:
the one or more control circuits are configured to choose the read process to read data based on comparing previously measured bit error rate information to a bit error rate threshold.

8. A non-volatile storage apparatus according to claim 1, wherein:
the one or more control circuits are configured to adjust sense time for the second read process based on bit error rate information.

9. A non-volatile storage apparatus according to claim 1, wherein:
the one or more control circuits are configured to adjust sense time for the second read process based on the temperature information.

10. A non-volatile storage apparatus according to claim 1, wherein:
the non-volatile memory cells are on a memory die;
the memory die includes a temperature detection circuit that detects the temperature information;
the one or more control circuits are configured to receive a request to read the data;
the one or more control circuits are configured to identify a target block storing the data;
the one or more control circuits are configured to access bit error rate information for the target block;
the one or more control circuits are configured to access read parameters for the target block; and
the one or more control circuits are configured to cause reading of the data from non-volatile memory cells using the determined read process and the accessed read parameters for the target block.

11. A non-volatile storage apparatus according to claim 10, wherein:
the one or more control circuits are configured to form a group that includes the target block with other blocks, the bit error rate information for the target block is an expected bit error rate range for the group; and
the one or more control circuits are configured to choose the read process to read data based on comparing the expected bit error rate range for the group to a bit error rate threshold and based on comparing a difference between current temperature and temperature at time of programming to a temperature threshold.

12. A non-volatile storage apparatus according to claim 11, wherein:
the one or more control circuits are configured to use the first read process with slower sense time if the difference between current temperature and temperature at time of programming is greater than the temperature threshold or if the expected bit error rate range for the group is greater than the bit error rate threshold.

13. A non-volatile storage apparatus according to claim 10, wherein:
the one or more control circuits are configured to form a group that includes the target block with other blocks, the bit error rate information for the target block is an expected bit error rate range for the group;
the one or more control circuits are configured to choose the read process to read data based on comparing the expected bit error rate range for the group to a bit error rate threshold; and
the one or more control circuits are configured to adjust the expected bit error rate range based on current temperature.

14. A non-volatile storage apparatus according to claim 10, wherein:
the one or more control circuits are configured to form a group that includes the target block with other blocks, the bit error rate information for the target block is an expected bit error rate range for the group;
the one or more control circuits are configured to choose the read process to read data based on comparing the expected bit error rate range for the group to a bit error rate threshold; and
the one or more control circuits are configured to adjust the bit error rate threshold based on current temperature.

15. A non-volatile storage apparatus according to claim 1, wherein:
the bit error rate is a measured bit error rate from a previously successful read operation.

16. A non-volatile storage apparatus according to claim 1, wherein:

the plurality of non-volatile memory cells are on a first die;

the one or more control circuits comprise a Controller that is on a second die;

the first die includes a temperature detection circuit, the one or more control circuits are configured to choose the read process to read data based on output of the temperature detection circuit.

17. A non-volatile storage apparatus according to claim 1, wherein:

the plurality of non-volatile memory cells are on a first die; and the one or more control circuits comprise a state machine circuit on the first die.

18. A non-volatile storage apparatus according to claim 1, wherein:

the plurality of non-volatile memory cells are part of a monolithic three dimensional memory structure.

19. A method of reading from non-volatile storage, comprising:

identifying error information associated with particular data stored in a non-volatile memory structure, the identifying error information includes accessing expected bit error rate data associated with the particular data;

obtaining temperature data related to temperature at the non-volatile memory structure, the obtaining temperature data includes obtaining a current temperature and accessing a temperature at time of programming;

choosing a read process from a plurality of different read processes based on the error information and the temperature data, the choosing the read process includes selecting the read process based on comparing the expected bit error rate data to a bit error rate threshold and based on comparing a difference between current temperature and temperature at time of programming to a temperature threshold; and causing reading of the particular data using the chosen read process.

20. A method according to claim 19, wherein:

the choosing the read process includes determining whether to use a first read process with slower sense time or a second read process with faster sense time.

21. An apparatus, comprising:

a first communication interface configured to communicate with a computing device;

a second communication interface configured to communicate with one or more memory dies; and one or more processors connected with the first communication interface and the second communication interface, the one or more processors are configured to receive a request to read data via the first communication interface and identify a physical block in one of the memory dies that is storing the data, the one or more processors are configured to identify read parameters associated with the physical block, the read parameters include bit error rate information, the one or more processors are configured to determine whether to use a faster read process or slower read process based on the bit error rate information and temperature data, the one or more processors are configured to cause reading of the data from the physical block using the determined read process and at least a subset of the read parameters.

22. The apparatus of claim 21, wherein:

the one or more processors are configured to determine whether to use the faster read process or the slower read process based on the comparing the bit error rate information to a bit error threshold and comparing a difference between current temperature and temperature at time of programming to a temperature threshold.

23. The apparatus of claim 22, wherein:

the faster read process includes a shorter sense time in the one or more memory dies; and the slower read process includes a longer sense time in the one or more memory dies.

24. A non-volatile storage apparatus, comprising:

a three dimensional memory structure including bit lines, word lines and a plurality of non-volatile memory cells arranged in blocks, memory cells in a common block share bit lines and word lines; and means for reading the memory cells including:

means for performing a first read process with a slower sense time, means for performing a second read process with a faster sense time, and means for choosing to use the first read process or the second read process based on temperature and bit error rate.

* * * * *